United States Patent
Takaya et al.

(10) Patent No.: US 6,808,642 B2
(45) Date of Patent: Oct. 26, 2004

(54) METHOD FOR PRODUCING MULTILAYER SUBSTRATE AND ELECTRONIC PART, AND MULTILAYER ELECTRONIC PART

(75) Inventors: Minoru Takaya, Tokyo (JP); Toshikazu Endo, Tokyo (JP); Masami Sasaki, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 10/238,677

(22) Filed: Sep. 11, 2002

(65) Prior Publication Data

US 2003/0029830 A1 Feb. 13, 2003

Related U.S. Application Data

(63) Continuation of application No. PCT/JP01/11499, filed on Dec. 27, 2001.

(30) Foreign Application Priority Data

Dec. 28, 2000 (JP) .................................. 2000-401493
Feb. 5, 2001 (JP) .................................. 2001-028854

(51) Int. Cl.$^7$ .......................... H01B 13/00; H05K 3/00; H05K 3/10
(52) U.S. Cl. .............. 216/13; 29/829; 29/846
(58) Field of Search .......................... 156/233; 216/13, 216/20, 33; 174/250, 255, 256; 29/830; 428/646; 438/617, 106, 123

(56) References Cited

U.S. PATENT DOCUMENTS 4,829,134 A * 5/1989 Sakamoto et al. .......... 525/523
5,731,047 A * 3/1998 Noddin ....................... 427/555
6,143,116 A * 11/2000 Hayashi et al. ............. 156/233
6,362,434 B1 * 3/2002 Yoshida et al. ............. 174/256

FOREIGN PATENT DOCUMENTS

| JP | 07-56846 | 6/1995 | | |
|---|---|---|---|---|
| JP | 08-069712 | 3/1996 | | |
| JP | 2830071 | 9/1998 | | |
| JP | 10-270255 | 10/1998 | | |
| JP | 2876088 | 1/1999 | | |
| JP | 2893351 | 3/1999 | | |
| JP | 11-192620 | 7/1999 | | |
| JP | 11-251142 | 9/1999 | | |
| JP | 11251142 A | * | 9/1999 | ........... H01F/17/00 |
| JP | 2000-058362 | 2/2000 | | |
| JP | 2000058362 A | * | 2/2000 | ........... H01F/41/04 |
| JP | 2001-347600 | 12/2001 | | |

* cited by examiner

Primary Examiner—Gregory Mills
Assistant Examiner—Roberts Culbert
(74) Attorney, Agent, or Firm—Oblon, Spivak, McClelland, Maier & Neustadt, P.C.

(57) ABSTRACT

This invention has an object of providing a method for producing a multilayer substrate or an electronic part wherein decrease in the thickness has been enabled without causing the problem of insufficient strength or the like in the handling, as well as the electronic part. Such object has been attained by a method for producing a multilayer substrate or an electronic part comprising the steps of adhering a conductor layer to a transfer film, patterning the conductor layer to form a predetermined pattern, placing the transfer film overlaid with the patterned conductor layer on a prepreg so that the side of the conductor layer faces the prepreg, and then adhering the transfer film to the prepreg by applying heat and pressure and peeling the transfer film to produce the prepreg having the conductor layer formed thereon; and the multilayer electronic part produced by such method.

20 Claims, 32 Drawing Sheets

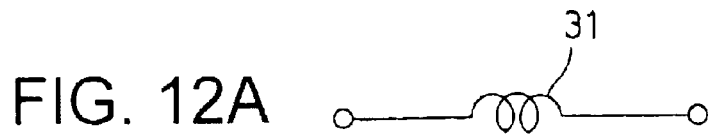
FIG. 12A
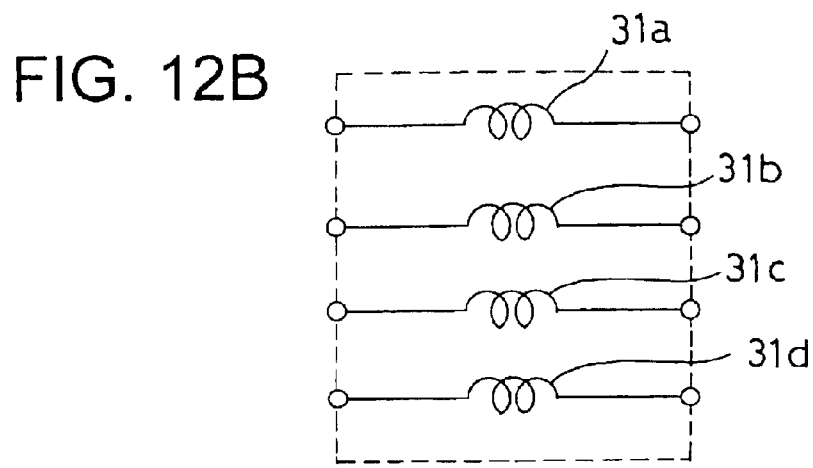
FIG. 12B
FIG. 13
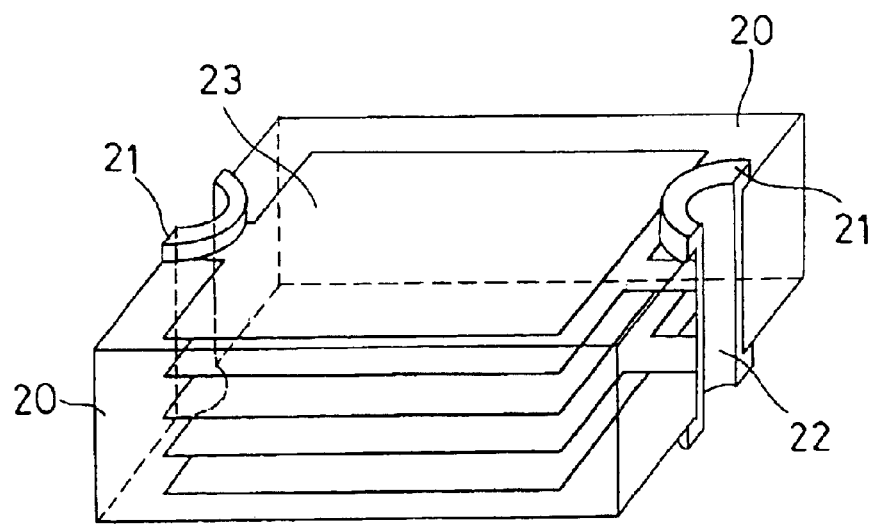

METHOD FOR PRODUCING MULTILAYER SUBSTRATE AND ELECTRONIC PART, AND MULTILAYER ELECTRONIC PART

CROSS-REFERENCES TO RELATED APPLICATIONS

This application is a continuation of International PCT Application No. PCT/JP01/11499 filed on Dec. 27, 2001 which claims priority to Japanese patent application Nos. JPAP 2000-401493, filed on Dec. 28, 2000 and JPAP 2001-028854, filed on Feb. 5, 2001 in the Japanese Patent Office.

BACKGROUND OF THE INVENTION

1. Field of the Invention

This invention relates to a method for producing a multilayer substrate or an electronic part wherein a prepreg or a substrate is used, and also, to an electronic part produced by such method. More specifically, this invention relates to a method for producing a multilayer substrate or an electronic part as well as an electronic part wherein decrease in the layer thickness has been enabled.

2. Description of the Related Art

In the field of electronic equipment for communication, commercial and industrial applications, the current mounting technology seeks further miniaturization and higher density packaging. Concomitant with this trend, materials are required to have better heat resistance, dimensional stability, electrical characteristics and moldability.

Known electronic parts or multilayer substrates for high frequency operation include sintered ferrite and sintered ceramics which are laminated and molded into substrate form. Laminating such materials into multilayer substrates has been practiced in the art because of the advantage of potential miniaturization.

The use of sintered ferrite and sintered ceramics, however, gives rise to several problems. A number of steps are involved in firing and thick film printing. Sintered materials suffer from inherent defects including cracks and warp caused by firing. Cracks are also induced by the differential thermal expansion between sintered material and printed circuit board. It is thus increasingly required to replace the sintered materials by resinous materials.

With resinous materials as such, however, a satisfactory dielectric constant is arrived at with great difficulty, and little improvement in magnetic permeability is achievable. Then, electronic parts utilizing resinous materials as such fail to provide satisfactory characteristics and become large in size, rendering it difficult to reduce the size and thickness of electronic parts.

It is also known from JP-A 10-270255, JP-A 11-192620 and JP-A 8-69712 to mix resinous materials with ceramic powder into composite materials. These composite materials, however, were insufficient in both dielectric constant and magnetic permeability. There was also a problem that increase in the loading of the ceramic powder for the purpose of increasing the dielectric constant was associated with decrease in the strength of the product, and hence, with an increased susceptibility to breakage during the handling and processing.

In addition, these substrates are constituted from a reinforcement such as a glass cloth impregnated with a paste, and thickness of the constituent layer could not be reduced beyond the thickness of the glass cloth. Such substrate also suffered from insufficient reliability and loss of characteristics due to moisture absorption between the glass cloth and the matrix.

Production of a substrate without using a glass cloth is disclosed, for example, in JP-B 6-14600 wherein a sheet of 150 $\mu$m is produced by coating and drying of a PET film. This sheet, however, is as thick as 150 $\mu$m, and there is no indication for the method of forming the electrode. If the substrate is assumed to have been fabricated by normal method, further reduction in the thickness is difficult.

In view of the rapid progress and widespread use of mobile equipment, decrease in the thickness of the substrate is critical in realizing equipment with reduced thickness and size.

SUMMARY OF THE INVENTION

An object of the present invention is to provide a method for producing a multilayer substrate or an electronic part as well as multilayer electronic part wherein decrease in the thickness has been enabled without causing the problem of insufficient strength or the like in the handling.

Such object is attained by the present invention constituted as described below.

(1) A method for producing a multilayer substrate comprising the steps of
   adhering a conductor layer to a transfer film,
   patterning the conductor layer by etching to form a predetermined pattern,
   placing the transfer film overlaid with the patterned conductor layer on a prepreg so that the side of the conductor layer faces the prepreg, and then
   adhering the transfer film to the prepreg by applying heat and pressure and peeling the transfer film to produce the prepreg having the conductor layer formed thereon.

(2) The method for producing a multilayer substrate according to the above (1) wherein said adhesion by heat and pressure application is conducted under the conditions including a temperature of 140 to 160° C., a pressure of 4.9 to 39 MPa, and a processing time of 120 to 180 minutes.

(3) The method for producing a multilayer substrate according to the above (1) or (2) further comprising the step of heat treating said transfer film at 100 to 130° C. for 5 to 20 minutes before placing the transfer film on the prepreg.

(4) The method for producing a multilayer substrate according to any one of the above (1) to (3) wherein the prepreg produced comprises a resin, and at least one of a dielectric powder and a magnetic powder dispersed in the resin, and has a thickness of 2 to 40 $\mu$m.

(5) The method for producing a multilayer substrate according to any one of the above (1) to (4) further comprising the step of placing another prepreg on the patterned surface of said prepreg, and adhering the placed prepreg by applying heat and pressure to produce a multilayer substrate having an inner conductor pattern.

(6) The method for producing a multilayer substrate according to any one of the above (1) to (5) wherein said conductor layer has a surface roughness Rz of 1 to 6 $\mu$m.

(7) The method for producing a multilayer substrate according to any one of the above (1) to (5) wherein said conductor layer comprises at least one element selected from Cu, Al, Ag, and Au.

(8) The method for producing a multilayer substrate according to any one of the above (1) to (5) wherein said conductor layer is the one formed by electrolysis or rolling.

(9) The method for producing a multilayer substrate according to any one of the above (1) to (5) wherein said conductor layer has a thickness of 3 to 32 $\mu$m.

(10) The method for producing a multilayer substrate according to any one of the above (4) to (9) wherein said dielectric powder comprises at least one member selected from titanium-barium-neodymium base ceramics, titanium-barium-tin base ceramics, lead-calcium base ceramics, titanium dioxide base ceramics, barium titanate base ceramics, lead titanate base ceramics, strontium titanate base ceramics, calcium titanate base ceramics, bismuth titanate base ceramics, magnesium titanate base ceramics, $CaWO_4$ base ceramics, $Ba(Mg,Nb)O_3$ base ceramics, $Ba(Mg,Ta)O_3$ base ceramics, $Ba(Co,Mg,Nb)O_3$ base ceramics, and $Ba(Co,Mg,Ta)O_3$ base ceramics.

(11) The method for producing a multilayer substrate according to any one of the above (4) to (9) wherein said dielectric powder comprises at least one member selected from silica, alumina, zirconia, potassium titanate whiskers, calcium titanate whiskers, barium titanate whiskers, zinc oxide whiskers, chopped glass, glass beads, carbon fibers, and magnesium oxide.

(12) The method for producing a multilayer substrate according to any one of the above (4) to (11) wherein said dielectric powder is included at a content in the range of from 10% by volume to less than 65% by volume when the total of the resin and the dielectric powder is 100% by volume.

(13) The method for producing a multilayer substrate according to any one of the above (4) to (12) wherein said magnetic powder comprises at least one member selected from ferrites of Mn—Mg—Zn, Ni—Zn, and Mn—Zn base systems.

(14) The method for producing a multilayer substrate according to any one of the above (4) to (12) wherein said magnetic powder comprises at least one member selected from iron carbonyl, iron-silicon base alloys, iron-aluminum-silicon base alloys, iron-nickel base alloys, and amorphous base ferromagnetic metals.

(15) The method for producing a multilayer substrate according to any one of the above (4) to (14) wherein said dielectric powder or said magnetic powder has a spherical shape with a projected image of circle and a sphericity of 0.9 to 1.0, and a mean particle size of 0.1 to 40 $\mu$m.

(16) A method for producing electronic parts comprising the steps of forming electronic part devices by patterning at least the conductor layer of the multilayer substrate of any one of the above (4) to (15), forming throughholes which function as a terminal for each electronic part device, and cutting the substrate at the positions of said throughholes into each electronic part device to thereby produce the electronic parts.

(17) A multilayer electronic part produced by the production method of the above (16).

(18) A multilayer electronic part wherein said multilayer electronic part comprises constituent layers which comprise at least one of a dielectric material and a magnetic material dispersed in a resin, and which include no glass cloth, and said constituent layer including no glass cloth has a thickness of 2 to 40 $\mu$m.

BRIEF DESCRIPTION OF THE DRAWINGS

FIG. 12 is an equivalent circuit diagram of the inductor which is an exemplary electronic part of the invention.

FIG. 13 illustrates a capacitor as one exemplary electronic part of the invention.

DETAILED DESCRIPTION OF THE PREFERRED EMBODIMENTS

In the method for producing the multilayer substrate according to the present invention, a prepreg having the conductor layer formed thereon is produced by adhering a conductor layer to a transfer film, patterning the conductor layer by etching to form the predetermined pattern, placing the transfer film overlaid with the patterned conductor layer on a prepreg so that the side of the conductor layer faces against the prepreg, and then adhering the transfer film to the prepreg by applying heat and pressure and peeling the transfer film to thereby obtain the prepreg having the conductor layer formed thereon.

The transfer film may be preliminarily heat treated at 100 to 130° C. for 5 to 20 minutes to promote foaming of the adhesive of the transfer film before the transfer.

Such production method has enabled to produce a thin multilayer substrate which is free from the reinforcement such as glass cloth, and which has a thickness of up to 40 μm.

Use of the thus produced constituent layers has the following merits.

(1) Production of an electronic part and a multilayer circuit substrate which are small in size and excellent in performance, which has low specific weight and high processibility, and which is flexible is enabled.

(2) A highly functional electronic part can be produced with reduced risk of suffering from cracks, peeling, warp, and the like even when materials having different properties are laminated due to the high flexibility.

(3) Production is easy since no step of sintering, thick film printing, or the like is included, and designing of the trouble free production line is facilitated.

(4) By omitting the use of glass cloth, high reliability is achieved, and increase in the loading of the dielectric powder and magnetic powder is also enabled to realize high dielectric constant and high magnetic permeability.

(5) High pattern accuracy is realized since the pattern is formed by etching.

(6) Decrease in the lot-to-lot variation in the properties is enabled by omitting the use of the glass cloth.

(7) Strength can be easily improved by incorporating a layer including a glass cloth.

(8) The product enjoys an improved reliability since the substrate is not subjected etching step, and the product does not suffer from the possibility of the etching solution remaining on the product.

Figure 1:
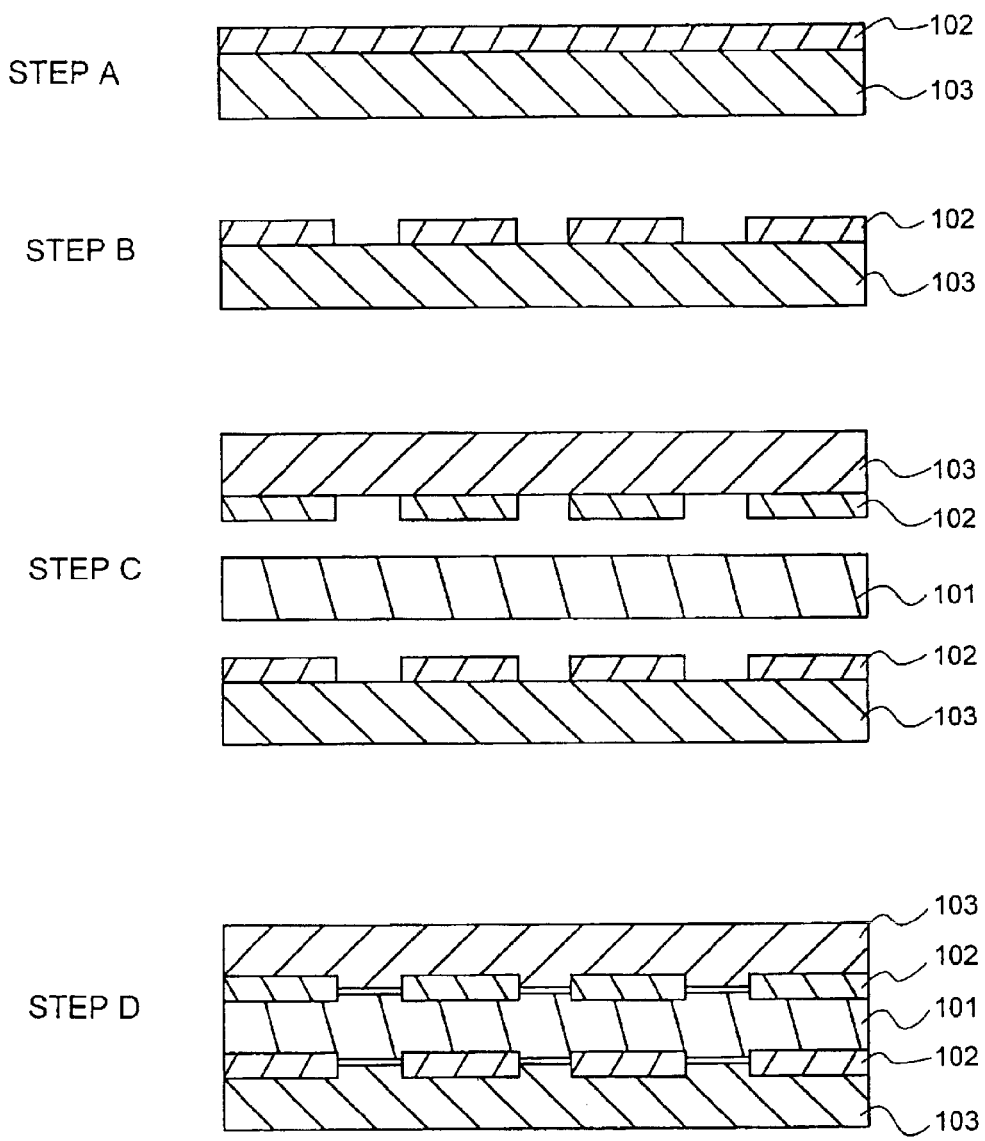
FIG. 1 illustrates consecutive steps in producing the constituent layer of the multilayer substrate of the present invention.
Figure 2:
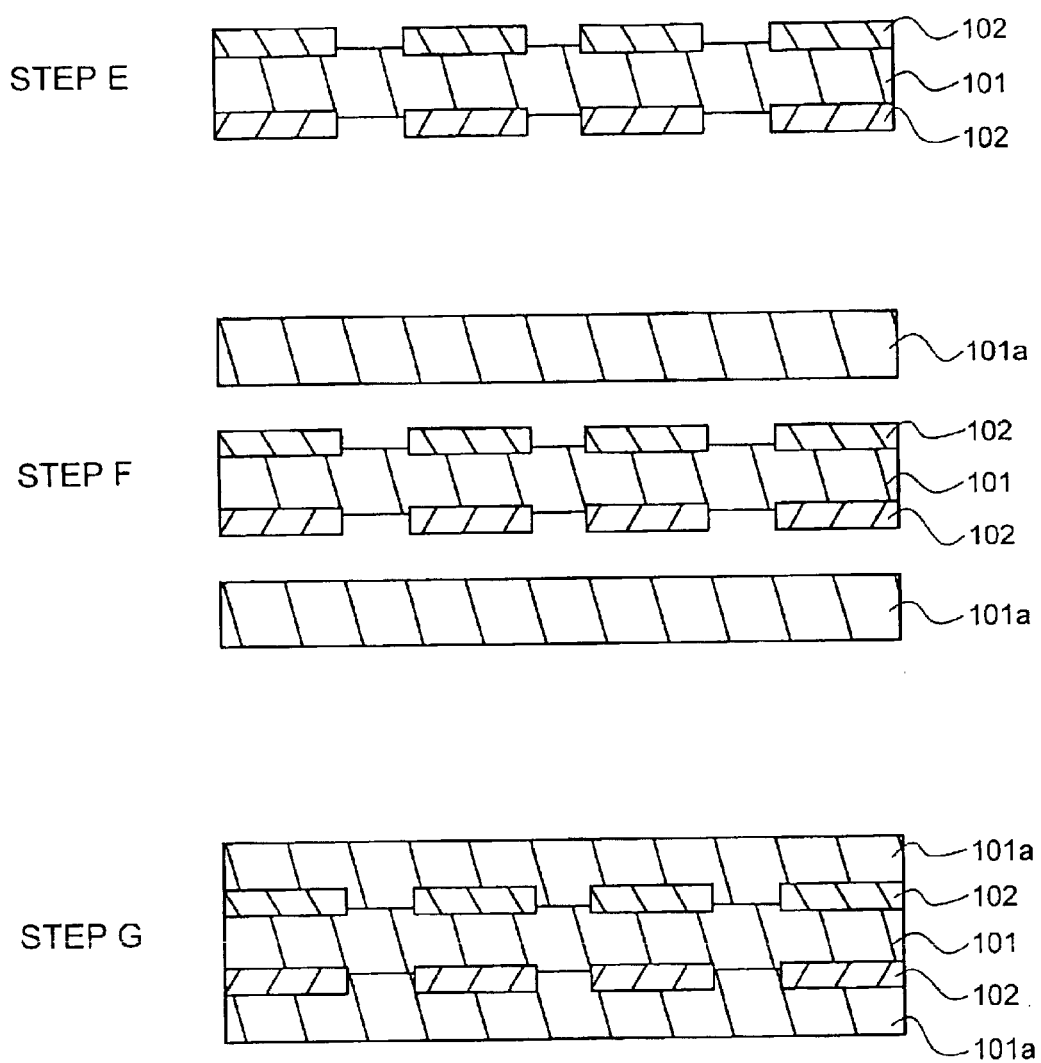
FIG. 2 illustrates consecutive steps in producing the constituent layer of the multilayer substrate of the present invention.

To be more specific, the multilayer substrate of the present invention may be produced by the method as illustrated in FIGS. 1 and 2.

First, a copper (Cu) foil 102 of predetermined thickness which is the conductor layer is overlaid on and adhered to a transfer film 103 of predetermined thickness as shown in FIG. 1, step A. It is to be noted that the adhesion surface of the transfer film may be preliminarily covered with a protective sheet, and this sheet may be removed just before the adhesion of the Cu foil. The adhesive strength of the transfer film is preferably up to 7 N/20 mm, and most preferably in the range of 3.7 to 7.0 N/20 mm. When the adhesive strength is 3.7 N/20 mm or less, the conductive layer may become peeled off in the subsequent etching step or the like, and the etching solution may intrude in between the layers. When the adhesive strength is in excess of the above specified range, peeling of the transfer film from the prepreg will be difficult.

Next, as shown in the step B, the copper foil 102 is patterned into the desired pattern, and then, as shown in the step C, a pair of transfer films 103 each having the patterned copper foil 102 thereon are disposed on opposite surfaces of the prepreg 101. It should be noted that the transfer film 103 may be disposed only on one side of the prepreg. A step of preliminarily heating the transfer film 103 may be incorporated to thereby subject the transfer film 103 to a heat treatment at a temperature of 100 to 130° C., and in particular, 110 to 120° C. for a period of 5 to 20 minutes, and in particular, 10 to 15 minutes for foaming (softening) the adhesive layer. This preheating step is most effective when the area occupied by the pattern on the transfer film is 80% or less, and in particular, 70% or less. In other words, such process of preheating is unnecessary when the area occupied by the pattern is in excess of 80% since the pattern formed over the area exceeding 80% of the transfer film is readily peelable and the transfer is easily accomplished due to the reduced contact area between the prepreg surface and the transfer film.

Next, as shown in step D, the transfer films 103 sandwiching the prepreg 101 are pressed toward the direction of the prepreg 101 at an elevated temperature and pressure for lamination. In the preferred embodiment, the prepreg becomes soft by the heat applied, and the adhesion of the prepreg with the copper foil pattern 102 is markedly facilitated. This facilitates peeling of the transfer film from the copper foil. The heat and pressure conditions used in this step may include a temperature of 130 to 170° C., and in particular, 140 to 160° C., and a pressure of 4.9 to 39 Mpa, preferably 4.9 to 30 Mpa, and in particular, 9.8 to 20 Mpa for a period of about 120 to 180 minutes. If the temperature used is too high, curing of the prepreg will be excessively promoted and the prepreg produced will suffer from insufficient adhesion in the subsequent lamination step of the constituent layers due to the poor resin flowability. If the temperature used is too low, transfer of the pattern will be difficult. When the pressure is too high, the transfer film will be firmly bonded to the prepreg to makes peeling of the film from the prepreg impossible. When the pressure is too low, the resin may enter the space between the pattern and the film, and this will cause various problems in the subsequent steps including difficulties in the plating, surface roughening, etching and the like.

Next, as shown in FIG. 2, step E, the transfer films 103 are peeled off to obtain the prepreg 101 having the copper foils 102 on both surfaces. If desired, as shown in step F, additional prepregs 101a may be disposed to sandwich the prepreg 101, and as shown in step G, the prepregs 101a may be pressed toward the prepreg 101 at an elevated temperature and pressure for lamination to thereby produce a multilayer substrate having an inner conductor pattern 102. It is to be noted that, when the pattern is transferred only to one surface of the prepreg, the additional prepreg 101a may also be disposed only on the patterned surface.

Alternatively, a plurality of constituent layers in the form of a laminate may be pressed at once. To be more specific, two or more prepregs having the copper foils attached on both sides and three or more prepregs may be alternately disposed one on another to form a laminate, and this laminate may be pressed at once at an elevated temperature and pressure. Such pressing of the laminate can reduce number of the pressing operations, and prevents deterioration of the resin by the repeated heating. The heat and pressure conditions used in such step may include a temperature of 180 to 210° C., and in particular, 190 to 200° C., and a pressure of 1 to 2 MPa, and in particular, 1.3 to 1.5 MPa for a period of about 60 to 120 minutes.

Prepregs from which multilayer substrates are fabricated are prepared by mixing the dielectric powder, magnetic powder, and optional flame retardant with the resin in a predetermined blend ratio, and milling the ingredients in a solvent into a slurry, followed by coating and drying to B stage. The solvent used herein for adjusting the viscosity of the paste for ease of coating is preferably a volatile solvent, especially a polar neutral solvent. Milling may be effected by well-known techniques such as ball milling and agitation. A prepreg can be fabricated by coating the paste onto a base.

Drying of the prepreg to B stage may be appropriately adjusted depending on the contents of dielectric powder, magnetic powder, and optional flame retardant. After drying, the B stage prepreg preferably has a thickness of up to 40 $\mu$m and can be adjusted to an optimum thickness depending on the intended application and required characteristics (including pattern width, precision and dc resistance).

The substrate or prepreg by which the multilayer substrate is constructed may be prepared by coating method, or by milling the ingredients and molding the solid mixture.

Milling may be effected by well-known techniques using ball mills, agitators and kneaders. A solvent may be used during the milling, if necessary. The mixture may be pelletized or powdered, if necessary.

The prepreg thus obtained generally has a thickness of up to 40 $\mu$m. The thickness of the prepreg may be determined as appropriate depending on the desired plate thickness, number of constituent layers, and the contents of dielectric powder and magnetic powder.

Of the constituent layers used in the multilayer substrate, the constituent layers produced by the method as described above are preferably those wherein at least the dielectric powder or the magnetic powder is dispersed in the resin, which include no glass cloth, and whose thickness is in the range of 2 to 40 $\mu$m.

The thickness of the constituent layer is in the range of 2 to 40 $\mu$m, preferably 5 to 35 $\mu$m, and more preferably 15 to 25 $\mu$m, and the preferable range may be also expressed as the range of 10 to 30 $\mu$m. When the constituent layer is thick, the multilayer substrate itself will be correspondingly thick to make the production of small-sized, thin electronic part difficult. Production of a capacitor having the desired capacity will also be difficult. When the thickness is insufficient, the strength will be correspondingly reduced and maintenance of the shape will be difficult.

The transfer film used for the transfer of the conductor layer is not particularly limited, and any film may be used as long as it has the strength and chemical stability to endure the etching procedure, and it has the adhesion ability and the peelability required for the transfer of the conductor layer. To be more specific, the transfer film is preferably the one comprising a supporting layer such as a resin film and an adhesive layer formed on the supporting layer.

Exemplary supporting layers include plastic films comprising a fluororesin such as polytetrafluoroethylene, tetrafluoroethylene-hexafluoropropylene copolymer, tetrafluoroethylene-perfluoroalkylvinylether copolymer, tetrafluoroethylene-ethylene copolymer, polychlorotrifluoroethylene, polyvinylidene fluoride, and polyvinyl fluoride, polyethylene films, polypropylene films, polystyrene films, polyvinyl chloride films, polyester films, polycarbonate films, polyimide films, polysulfone films, polyether sulfone films, polyamide films, polyamideimide films, polyetherketone films, polyphenylene sulfide films, and other known plastic films.

Among these, the preferred are polyethylene terephthalate (PET) films, biaxially oriented polypropylene (OPP) films, methylpentene copolymer (PTX) films, and fluororesin films. The preferable fluororesin films are films of ethylene fluoride (1F), ethylene trifluoride (3F) and ethylene tetrafluoride (4F).

The plastic film preferably has a thickness of about 10 $\mu$m to 200 $\mu$m, and most preferably, a thickness of about 15 $\mu$m to 150 $\mu$m.

Preferably, the adhesive layer has the nature that its adhesive strength reduces at an elevated temperature. A typical such adhesive layer is the one comprising a base polymer matrix and a foaming agent blended in the matrix. In the case of such an adhesive layer, the foaming agent foams by the heating of the adhesive layer to result in the decrease or loss of the adhesive strength. To be more specific, the base polymer may comprise a highly elastic polymer having a dynamic modulus at room temperature to 150° C. in the range of 500,000 to 10,000,000 $\mu$N/cm$^2$, and preferably 500,000 to 8,000,000 $\mu$N/cm$^2$. When the dynamic modulus is less than 500,000 $\mu$N/cm$^2$, the adhesive strength at room temperature will be too strong rendering the reattachment of the film difficult, and in addition, the adhesive strength of the adhesive layer will be only insufficiently reduced by the heat treatment, often resulting in the increase of the adhesive strength. On the other hand, when the dynamic modulus is in excess of 10,000,000 $\mu$N/cm$^2$, the adhesive strength at room temperature will be too weak, and inflation and foaming of the foaming agent upon heating will be suppressed to result in an insufficient decrease of the adhesive strength.

Furthermore, the highly elastic polymer is preferably the one which experiences small increase/decrease in the dynamic modulus in the temperature range of room temperature to 150° C., and to be more specific, the change in the dynamic modulus in such temperature range is preferably within 5 folds, and more preferably within 3 folds. The monomer which constitutes the highly elastic polymer is not particularly limited, and the monomer component used may be any monomer which is used in preparing a known pressure sensitive adhesive such as acrylic pressure sensitive adhesive, rubber pressure sensitive adhesive, and styrene-conjugated diene block copolymer pressure sensitive adhesive.

Exemplary such monomers include alkyl ester of an acrylic acid such as acrylic acid and methacrylic acid which has an alkyl group typically containing up to 20 carbon atoms such as methyl group, ethyl group, propyl group, butyl group, 2-ethylhexyl group, isooctyl group, isononyl group, isodecyl group, dodecyl group, lauryl group, tridecyl group, pentadecyl group, hexadecyl group, heptadecyl group, octadecyl group, nonadecyl group, and eicosyl group; acrylic acid, methacrylic acid, itaconic acid, hydroxyethyl acrylate, hydroxyethyl methacrylate, hydroxypropyl acrylate, hydroxypropyl methacrylate, N-methylol acrylamide, acrylonitrile, methacrylonitrile, glycidyl acrylate, glycidyl methacrylate, vinyl acetate, styrene, isoprene, butadiene, isobutylene, and vinylether. The natural rubbers and regenerated rubbers which satisfy the conditions for the highly elastic polymer as described above may also be used for the base polymer.

The foaming agent used may be either an inorganic or an organic foaming agent, and the foaming agent may be used at an amount adequately determined so that the decrease in the adhesive strength is enabled. Typically, the foaming agent is used at an amount of 1 to 100 parts by weight, preferably 5 to 50 parts by weight, and most preferably 10 to 40 parts by weight per 100 parts by weight of the base polymer.

Typical inorganic foaming agents include ammonium carbonate, ammonium hydrogencarbonate, sodium hydrogencarbonate, ammonium nitrite, sodium borohydride, and azides.

Typical organic foaming agents include water; chlorofluoroalkanes such as trichloromonofluoromethane and dichloromonofluoromethane; azo compounds such as azobisisobutyronitrile, azodicarbonamide, barium azodicarboxylate; hydrazine compounds such as p-toluenesulfonyl hydrazide, diphenylsulfone-3,3'-disulfonyl hydrazide, 4,4'-oxybis(benzenesulfonyl hydrazide), allylbis(sulfonyl hydrazide); semicarbazide compounds such as p-toluylene sulfonyl semicarbazide and 4,4'-oxybis (benzenesulfonyl semicarbazide); triazole compounds such as 5-morpholyl-1,2,3,4-thiatriazole; and N-nitroso compounds such as N,N'-dinitrosopentamethylenetetramine and N,N'-dimethyl-N,N'-dinitrosoterephthalamide. Thermo-expandable microspheres produced by microcapsulating the foaming agent are easy to mix, and hence preferable for use. The thermo-expandable microspheres used may be a commercially available product such as Microsphere (product name, manufactured by Matsumoto Yushi). If desired, the foaming agent may be used in combination with a foaming aid. Note that the adhesive layers which may be employed in the present invention are described in Japanese Patent Application Nos. 3-228861 and 5-226527 as a thermal release adhesive, and the like.

The adhesive layer is not limited for its thickness. The thickness, however, is preferably up to 100 $\mu$m, and more preferably up to 40 $\mu$m. The lower limit of the thickness is about 20 $\mu$m. When the adhesive layer is too thick, surface irregularity after the foaming will be excessive, and the pattern will be wrinkled. As a consequence, creases will be formed in the transfer step and the predetermined pattern will not be formed.

The resin used in the constituent layer of the multilayer substrate of the present invention is not critical. A proper choice may be made among resin materials having good moldability, processibility, adhesion during stacking, and electrical characteristics. Specifically, thermosetting resins and thermoplastic resins are preferred.

The thermosetting resins which can be used herein include epoxy resins, phenolic resins, unsaturated polyester resins, vinyl ester resins, polyimide resins, polyphenylene ether (or oxide) resins, bismaleimide triazine (or cyanate ester) resins, fumarate resins, polybutadiene resins, and polyvinyl benzyl ether resins. The thermoplastic resins which can be used herein include aromatic polyester resins, polyphenylene sulfide resins, polyethylene terephthalate resins, polybutylene terephthalate resins, polyethylene sulfide resins, polyether ether ketone resins, polytetrafluoroethylene resins, and graft resins. Among these, phenolic resins, epoxy resins, low dielectric epoxy resins, polybutadiene resins, BT resins, and polyvinyl benzyl ether resins are preferred as the base resin.

These resins may be used alone or in admixture of two or more. Mixtures may have any desired mixing ratio of two or more resin components.

The dielectric powder used in the present invention is preferably a ceramic powder, and any ceramic powder may be used insofar as it has a greater dielectric constant and Q value in the high-frequency region than the resin serving as a dispersing medium. It is acceptable to use two or more types of ceramic powders.

Preferably, a ceramic powder used has a dielectric constant of 10 to 20,000 and a dielectric dissipation factor of up to 0.05 when measured at a frequency of 1 to 2 GHz.

Where it is desired to provide a relatively high dielectric constant, the following materials are preferably used.

Preferred materials include titanium-barium-neodymium base ceramics, titanium-barium-tin base ceramics, lead-calcium base ceramics, titanium dioxide base ceramics, barium titanate base ceramics, lead titanate base ceramics, strontium titanate base ceramics, calcium titanate base ceramics, bismuth titanate base ceramics, magnesium titanate base ceramics, $CaWO_4$ base ceramics, $Ba(Mg,Nb)O_3$ base ceramics, $Ba(Mg,Ta)O_3$ base ceramics, $Ba(Co,Mg,Nb)O_3$ base ceramics, and $Ba(Co,Mg,Ta)O_3$ base ceramics. The titanium dioxide base ceramics include one consisting of titanium dioxide and those ceramics containing minor amounts of additives in addition to titanium dioxide, while they should maintain the crystalline structure of titanium dioxide. The same applies to the remaining ceramics. Of the titanium dioxide base ceramics, those having the rutile structure are preferred.

Where it is desired to provide a high Q without excessively increasing a dielectric constant, the following materials are preferably used.

Preferred materials include silica, alumina, zirconia, potassium titanate whiskers, calcium titanate whiskers, barium titanate whiskers, zinc oxide whiskers, chopped glass, glass beads, carbon fibers, and magnesium oxide (or talc).

These materials may be used alone or in admixture of two or more. Mixtures may have any desired mixing ratio of two or more components.

To be more specific, use of the materials as mentioned below is preferable when the material is not required to have a relatively high dielectric constant.

$Mg_2SiO_4$ [$\epsilon$=7, Q=20000 (Note that the measurement was conducted at a frequencey of 1 GHz which also applies to the following materials)], $Al_2O_3$ [$\epsilon$=9.8, Q=40000], $MgTiO_3$ [$\epsilon$=17, Q=22000], $ZnTiO_3$ [$\epsilon$=26, Q=800], $Zn_2TiO_4$ [$\epsilon$=15, Q=700], $TiO_2$ [$\epsilon$=104, Q=15000], $CaTiO_3$ [$\epsilon$=170, Q=1800], $SrTiO_3$ [$\epsilon$=255, Q=700], $SrZrO_3$ [$\epsilon$=30, Q=1200], $BaTiO_3$ [$\epsilon$=1500 to 20000], $BaTi_2O_5$ [$\epsilon$=42, Q=5700], $BaTi_4O_9$ [$\epsilon$=38, Q=9000], $Ba_2Ti_9O_{20}$ [$\epsilon$=39, Q=9000], $Ba_2(Ti,Sn)_9O_{20}$ [68 =37, Q=5000], $ZrTiO_4$ [$\epsilon$=39, Q=7000], $(Zr,Sn)TiO_4$ [$\epsilon$=38, Q=7000], $BaNd_2Ti_5O_{14}$ [$\epsilon$=83, Q=2100], $BaSm_2Ti_5O_{14}$ [$\epsilon$=74, Q=2400], $Bi_2O_3$—BaO—$Nd_2O_3$—$TiO_2$ base [$\epsilon$=88, Q=2000], PbO—BaO—$Nd_2O_3$—$TiO_2$ base [$\epsilon$=90, Q=5200], $(Bi_2O_3, PbO)$—BaO—$Nd_2O_3$—$TiO_2$ base [$\epsilon$=105, Q=2500], $La_2Ti_2O_7$ [$\epsilon$=44, Q=4000], $Nd_2Ti_2O_7$ [$\epsilon$=37, Q=1100], $(Li,Sm)TiO_3$ [$\epsilon$=81, Q=2050], $Ba(Mg_{1/3}Ta_{2/3})O_3$ [$\epsilon$=25, Q=35000], $Ba(Zn_{1/3}Ta_{2/3})O_3$ [$\epsilon$=30, Q=14000], $Ba(Zn_{1/3}Nb_{2/3})O_3$ [$\epsilon$=41, Q=9200], $Ba(Mg_{1/2}W_{1/2})O_3$ [$\epsilon$=20, Q=130000], $Ba(Mg_{1/3}Cr_{2/3})O_3$ [$\epsilon$=18, Q=115000], $Ba(Mg_{1/3}Nb_{2/3})O_3$ [$\epsilon$=32, Q=115000], $(Sr_{0.6}Ba_{0.4})(Ga_{1/2}Ta_{1/2})O_3$ [$\epsilon$=29, Q=115000], $Ca(Ga_{1/2}Ta_{1/2})O_3$ [$\epsilon$=31, Q=99400], $Sr(Zn_{1/3}Nb_{2/3})O_3$ [$\epsilon$=40, Q=4000], $BaWO_4$ [$\epsilon$=8, Q=2250], $MgSiO_3$ [$\epsilon$=6, Q=2500], $3(Al_2O_3)(SiO_2)$ [$\epsilon$=7.8, Q=250], $Ba(ZrTi)O_3$ [$\epsilon$=38, Q=48800], $BaZrO_3$ [$\epsilon$=40, Q=1400], $(SrCa)(TiSn)O_3$ [$\epsilon$=40, Q=72000], $SnO_2$—$TiO_2$ [$\epsilon$=43, Q=31500], $Sm(TiSn)NbO_6$ [$\epsilon$=46, Q=31300], $Nd(TiZr)NbO_6$ [$\epsilon$=50, Q=27600], $Nd(TiSn)NbO_6$ [$\epsilon$=50, Q=27600], $Sr_2Nb_2O_7$ [$\epsilon$=52, Q=700], $(BaSr)_5Nb_4O_{15}$ [$\epsilon$=50, Q=3500], $Ba_2(TiMnNi)_9O_{20}$ [$\epsilon$=50, Q=37600], $(SrCa)TiO_3$—$La(ZnMgTi)O_3$ [$\epsilon$=60, Q=25100], $MgTiO_3$—$CaTiO_3$ [$\epsilon$=21, Q=45000], $Ca(FeNbTi)O_3$ [$\epsilon$=69, Q=4000], $Ba(SmLa)_2Ti_5O_{14}$ [$\epsilon$=75, Q=9500], $Ba(SmLaCe)_2Ti_5O_{14}$ [$\epsilon$=76, Q=9500], $(BaSr)Sm_2Ti_5O_{14}$ [$\epsilon$=80, Q=11100], $BaNd_2(TiMn)_5O_{14}$ [$\epsilon$=77, Q=10200], $Ba(SmNd)_2Ti_5O_{14}$ [$\epsilon$=77, Q=9000], $Ba(NdSmLaBi)_2Ti_5O_{14}$ [$\epsilon$=90, Q=7500], $Ba(NdBi)_2(TiAl)_5O_{14}$ [$\epsilon$=92, Q=5600], $Ba(NdBi)_2Ti_5O_{14}$ [$\epsilon$=93, Q=5000], $(BaPb)Nd_2Ti5O_{14}$ [$\epsilon$=93, Q=5300], $(BaPb)(NdSmBi)_2Ti_5O_{14}$ [$\epsilon$=153, Q=800], $Ba(NdSmBi)_2Ti_5O_{14}$ [$\epsilon$=147, Q=1100], $Ba(NdGd)_2(TiAl)_5O_{14}$ [$\epsilon$=82, Q=5400], $(BaPb)(NdSmBiMg)_2Ti_5O_{14}$ [$\epsilon$=107, Q=2900], $(BaPb)(NdBi)_2Ti_5O_{14}$ [$\epsilon$=110, Q=2500], $Ba(NdGdBi)_2Ti_5O_{14}$ [$\epsilon$=115, Q=2900], $Ba(LaSmBi)_2(TiZr)_5O_{14}$ [$\epsilon$=117, Q=3100], $Ba(NdGdBi)_2Ti_5O_{14}$ [$\epsilon$=140, Q=1000], $(BaPb)(NdCeLa)_2Ti_5O_{14}$ [$\epsilon$=98, Q=5400], $CaSm_2Ti_5O_{14}$ [$\epsilon$=141, Q=3200], $CaNd_2Ti_5O_{14}$ [$\epsilon$=143, Q=3200], $CaY_2Ti5O_{14}$ [$\epsilon$=137, Q=3200], $CaGd_2Ti_5O_{14}$ [$\epsilon$=138, Q=3200], $CaEu_2Ti_5O_{14}$ [$\epsilon$=139, Q=3200], $CaPr_2Ti_5O_{14}$ [$\epsilon$=140, Q=3200], $(BaSrPb)(MgTa)O_3$ [$\epsilon$=125, Q=2000], $Pb(ZrCe)O_3$ [$\epsilon$=140, Q=2600], $Sr(ZnNb)O_3$ [$\epsilon$=40, Q=36800], $Ca(FeNb)O_3$ [$\epsilon$=40, Q=20000], $Ba(ZnNb)O_3$ [$\epsilon$=41, Q=86900], $Ba(NdNb)O_3$ [$\epsilon$=42, Q=15600], $Ca(NiNbTi)O_3$ [$\epsilon$=55, Q=12000], $Ca(CaNbTi)O_3$ [$\epsilon$=55, Q=35000], $(PbCa)ZrO_3$ [$\epsilon$=118, Q=3200], $(PbCa)HfO_3$ [$\epsilon$=100, Q=4700], $(PbCa)(MgZr)O_3$ [$\epsilon$=143, Q=1500], $(PbCa)(MgNb)O_3$ [$\epsilon$=86, Q=4100], $(PbCa)(ZrTiSn)O_3$ [$\epsilon$=137, Q=1700], $(PbCa)(FeNbTi)O_3$ [$\epsilon$=132, Q=2800], $(PbCa)(FeNbW)O_3$ [$\epsilon$=96, Q=3800], $(PbCa)(CrNb)O_3$ [$\epsilon$=48, Q=3600], $(PbCa)(NiNb)O_3$ [$\epsilon$=73, Q=5100], $(PbCa)(CoNb)O_3$ [$\epsilon$=75, Q=1400], $(PbCa)(FeNb)O_3$ [$\epsilon$=104, Q=3900], $(PbCa)(ZrSn)O_3$ [$\epsilon$=146, Q=1400], $(PbCa)(MgNiNb)O_3$ [$\epsilon$=116, Q=1800], $(PbCa)(FeTaNb)O_3$ [$\epsilon$=118, Q=1500], $(PbCa)(FeNbZr)O_3$ [$\epsilon$=144, Q=1600], $(PbCa)(NiNbZr)O_3$ [$\epsilon$=147, Q=500], $(PbCa)(MgNbZr)O_3$ [$\epsilon$=151, Q=1000], $(PbCa)(FeNbW)O_3$ [$\epsilon$=152, Q=1300], $(PbSr)(ZnNb)O_3$ [$\epsilon$=141, Q=1000], $(PbSrCa)(FeTaNb)O_3$ [$\epsilon$=115, Q=3100], $(BaSrCaPb)(ZnTaNb)O_3$ [$\epsilon$=85, Q=8000], $(BaSrPb)(MgTaNb)O_3$ [$\epsilon$=90, Q=6000], $(NdSr)TiO_3$ [$\epsilon$=220, Q=6000], $(SrCa)TiO_3$ [$\epsilon$=266, Q=1100], $SrSnO_3$ [$\epsilon$=129, Q=1200], $(SrCa)_3Ti_2O_3$ [$\epsilon$=77, Q=10200], $(BaCa)TiO_3$, $Ba(TiSn)O_3$ [$\epsilon$=1500 to 10000], $(PbSr)TiO_3$ [$\epsilon$=300 to 400], $Pb(ZnNb)O_3$—$Pb(FeW)O_3$ [$\epsilon$=24000], Pb-based complex perovskite [$\epsilon$=several ten thousands], and the like.

More preferably, the material is the one containing the substance of the following composition as its main component.

$TiO_2$, $CaTiO_3$, $SrTiO_3$, $Ba(Mg_{1/3}Ta_{2/3})O_3$, $Ba(Zn_{1/3}Ta_{2/3})O_3$, $Sr(Zn_{1/3}Nb_{2/3})O_3$, $Al_2O_3$, $MgTiO_3$, $Nd_2Ti_2O_7$, $MgTiO_3$—$CaTiO_3$, $BaSm_2Ti_5O_{14}$, $BaNd_2Ti_5O_{14}$, BaO—$Nd_2O_3$—$TiO_2$ base, $Bi_2O_3$—BaO—$Nd_2O_3$—$TiO_2$ base, $BaTiO_3$, $BaTi_2O_5$, $BaTi_4O_9$, $Ba_2Ti_9O_{20}$, $(BaCa)TiO_3$, $(BaSr)TiO_3$, $Ba(TiSn)O_3$, $Ba(TiZr)O_3$, $Ba_2(Ti,Sn)_9O_{20}$ base, MgO—$TiO_2$ base, ZnO—$TiO_2$ base, MgO—$SiO_2$ base, $Al_2O_3$, and the like.

On the other hand, use of the materials as mentioned below is preferable when the material is required to have a relatively high dielectric constant.

$BaTiO_3$ [$\epsilon$=1500 (Note that the measurement was conducted at a frequencey of 1 GHz which also applies to the following materials)], $(Ba,Pb)TiO_3$ base [$\epsilon$=6000], $Ba(Ti,Zr)O_3$ base [$\epsilon$=9000], and $(Ba,Sr)TiO_3$ base [$\epsilon$=7000].

More preferably, the material is selected from dielectric powders based on the following compositions.

$BaTiO_3$ and $Ba(Ti,Zr)O_3$ base.

The ceramic powder may also be a single crystal or polycrystalline powder.

The content of ceramic powder is generally from 10% by volume to 65% by volume provided that the total of the resin and ceramic powder is 100% by volume. Preferably, the content of ceramic powder is 20 to 60% by volume.

A ceramic powder content of more than 65% by volume may fail to provide a consolidated layer and rather result in a substantial drop of Q as compared with ceramic powder-free compositions. With less than 10% by volume, ceramic powder may fail to exert the desired effect.

By properly selecting the respective components within the above range, the multilayer substrate of the present invention can have a greater dielectric constant than that of the resin alone, that is, have a dielectric constant as desired and a high Q.

The dielectric powder may have either a spherical or ellipsoidal shape, or an irregular shape as in the case of pulverized material. When the dielectric powder has a spherical shape with a circular projected image, the material may preferably have a mean particle size of 0.1 to 40 $\mu$m, and more preferably 0.5 to 20 $\mu$m, and a sphericity of 0.9 to 1.0, and more preferably 0.95 to 1.0.

When the dielectric powder has a mean particle size of less than 0.1 $\mu$m, surface area of the particles will be increased, and viscosity and thixotropy after the dispersion and stirring will be increased to render increase of the packing density and kneading with the resin difficult. On the other hand, when the mean particle size is in excess of 40 $\mu$m, uniform dispersion and mixing will be difficult and the mixture will be inconsistent with accelerated sedimentation, and production of a compact article by molding will be difficult.

When the sphericity is less than 0.9, the particles will be less likely to be uniformly dispersed in the production of a molded article such as compressed core, and this may result in the inconsistent dielectric properties detracting from the desired properties and causing lot-to-lot as well as piece-to-piece variations of the products. The sphericity may be determined by measuring a plurality of randomly selected samples and calculating the average value, and this average value should be within the above-described range.

When the pulverized material is incorporated, the pulverized material may preferably have a particle size of 0.01 to 40 μm, and more preferably 0.01 to 35 μm, and a mean particle size of 1 to 30 μm. Use of a pulverized material having such particle size results in sufficient dispersion of the material. When the pulverized material has a particle size below such range, specific surface area will be excessively large, and increase in the packing density will be difficult. On the other hand, use of the material having a particle size beyond such range results in the accelerated sedimentation of the particles when the material is incorporated in a paste, and uniform dispersion will be difficult. In addition, surface smoothness will be difficult to attain when a thin substrate or prepreg is to be produced. The lower limit of the particle size is about 0.01 μm since production of a material having an excessively small particle size is difficult and impractical.

The means used for dividing these materials into particles may be any of the well-known techniques such as grinding and granulation.

The dielectric material may contain a pulverized material in addition to the spherical dielectric powder. Incorporation of the pulverized material enables increase in the packing density.

The multilayer substrate of the present invention may further comprise one or more magnetic powder separately from the dielectric powder or in admixture with the dielectric powder.

The magnetic powder used may be a ferrite. Examples of the ferrite include Mn—Mg—Zn, Ni—Zn, and Mn—Zn base systems, with the single crystal of such ferrite, Mn—Mg—Zn and Ni—Zn base systems being particularly preferred.

Alternatively, the magnetic powder used may be a ferromagnetic metal. Exemplary ferromagnetic metals include iron carbonyl, iron-silicon base alloys, iron-aluminum-silicon base alloys (trade name: Sendust), iron-nickel base alloys (trade name: Permalloy), and amorphous alloys including iron and cobalt base alloys.

Means for dividing these materials into particles may be well-known techniques such as grinding and granulation.

The magnetic powder may have a particle size and a shape similar to those of the dielectric powder, and the magnetic powder is preferably the one having a smooth surface as in the case of the dielectric powder. Use of a pulverized material, however, is also acceptable, and merits similar to those described above will be attained by the use of such pulverized material.

It is acceptable to use two or more magnetic powders which differ in type or particle size distribution. Such different magnetic powders may be mixed in any desired ratio. The type, the particle size, and the mixing ratio of the magnetic powders may be determined depending on a particular application.

The magnetic powder may preferably have a magnetic permeability μ of 10 to 1,000,000 when measured at a frequency of 1 to 2 GHz. It is preferred that the magnetic powder in bulk form has greater insulation because substrates formed therefrom are improved in insulation.

The resin and the magnetic powder are preferably mixed in such a ratio that the resulting constituent layer in its entirety has a magnetic permeability of 3 to 20 when measured at a frequency of 1 to 2 GHz. At the stage of a paste to be molded, the content of magnetic powder is 10 to 65% by volume, especially 20 to 60% by volume, based on the total of the resin and the magnetic powder. The content of the magnetic powder within this range ensures that the resulting constituent layer in its entirety has a magnetic permeability of 3 to 20, enabling to attain desired electric properties. Too large a magnetic powder content may make it difficult to form a slurry for coating and hence, to form a multilayer substrate. Too small a magnetic powder content may fail to provide the desired magnetic permeability, detracting from magnetic characteristics.

The flame retardant used herein may be selected from a variety of flame retardants which are conventionally used for rendering substrates flame retardant. Exemplary flame retardants include halides such as halogenated phosphates and brominated epoxy resins, organic compounds such as phosphate amides base, and inorganic substances such as antimony trioxide and aluminum hydride.

The metal foil used herein as the conductor layer may be selected from metals having good electrical conductivity such as gold, silver, copper and aluminum. Of these, copper is especially preferred.

The metal foil may be formed by well-known methods such as electrolysis and rolling. Electrolytic foil is preferably used where it is desired to provide a foil peel strength. Rolled foil which is least affected by the skin effect due to surface irregularities is preferably used where high-frequency characteristics are important. The metal foil may have a surface roughness Rz in the range of 1 to 6 μm. To be more specific, an electrolytic foil may preferably have an Rz of 2.5 to 6.0 μm, and a rolled foil may preferably have an Rz of 1.0 to 3.0 μm.

The metal foil preferably has a gage of about 3.0 to 32 μm, and especially about 3.0 to 18 μm in consideration of reducing the thickness of the product.

The multilayer substrate of the present invention may further comprise a constituent layer including reinforcing fibers typically in the form of glass cloth in addition the constituent layers including no glass cloth as describe above. Strength of the entire multilayer substrate can be improved by incorporating the reinforcement fiber-containing constituent layer.

The reinforcing fibers typically in the form of glass cloth used in the glass cloth-containing constituent layer may be selected from a variety of known reinforcements depending on a particular purpose and application. Commercially available reinforcements may be used without further treatment. Exemplary reinforcing fibers are E glass cloth ($\epsilon$=7, tan $\delta$=0.003 at 1 GHz), D glass cloth ($\epsilon$=4, tan $\delta$=0.0013 at 1 GHz) and H glass cloth ($\epsilon$=11, tan $\delta$=0.003 at 1 GHz), from which a choice may be made depending on the desired electrical characteristics. Reinforcing fibers may be subject to coupling treatment in order to enhance interlayer adhesion. The glass cloth preferably has a thickness of up to 100 μm, more preferably 20 to 60 μm, and a weight of up to 120 g/m$^2$, especially 20 to 70 g/m$^2$.

Preferably the resin and glass cloth are mixed in a weight ratio of from 4/1 to 1/1. A mixing ratio within this range ensures to exert the desired effect. With a lower ratio or a smaller content of resin, the resulting composite material may lose adhesion to copper foil and form a less flat substrate. Inversely, with a higher ratio or a larger content of resin, the choice of glass cloth which can be used may become difficult and it may become difficult to ensure the strength of a thin-wall substrate.

The multilayer substrate of the present invention may comprise a stuck comprising two or more different constituent layers. In addition, the constituent layer may comprise two or more different materials dispersed in the composite material. Such combination of two or more different constituent layers or two or more different powder materials, and combination of two or more powder materials of the same type having different compositions, electric properties (such as dielectric constant), or magnetic characteristics with the resin facilitates adjustment of the dielectric constant or the magnetic permeability, enabling production of electronic parts having the optimal properties. To be more specific, adjustment of the dielectric constant and the magnetic permeability which are effective in the wavelength reduction to their optimal value enables reduction of the size and thickness of the device. In addition, combination of a material which exhibits favorable electric properties in the relatively low frequency region with a material which exhibits favorable electric properties in the relatively high frequency region facilitates realization of improved electric properties in a wide frequency region.

When the multilayer substrate and the electronic part are fabricated using the hybrid layers, namely, the constituent layers comprising a mixture of the resin, the dielectric powder, and the magnetic powder, the bonding with the copper foil, the patterning, and the lamination without using any adhesive. Such patterning and lamination can be conducted through the same steps as conventional multilayer substrate manufacturing steps, contributing to a cost reduction and efficient manufacture. Electronic parts using the thus fabricated multilayer substrates have a high strength and improved high-frequency characteristics.

Increase in the dielectric constant has the effect of reducing the wavelength. To be more specific, the effective wavelength λ on the substrate is given by $$\lambda = \lambda_0 / (\epsilon \cdot \mu)^{1/2}$$

wherein $\lambda_0$ is the wavelength used, and $\epsilon$ and $\mu$ are the dielectric constant and the magnetic permeability of the electronic part or the substrate, respectively. Accordingly, when an electronic part or circuit at λ/4 is designed, size of the part requiring the length of λ/4 can be reduced by a length of the wavelength divided by the square root of the product of $\epsilon$ and $\mu$ by increasing the $\epsilon$ and the $\mu$ of the member constituting the circuit. Reduction in size of the electronic part or the substrate is thereby enabled at least by increasing the $\epsilon$ of the material used for the electronic part or the substrate.

In addition, combination of a material which exhibits favorable electric properties in the relatively low frequency region with a material which exhibits favorable electric properties in the relatively high frequency region facilitates realization of improved electric properties including HPF in a wide frequency region typically in the range of 1 to 2000 MHz, and in particular, in the range of 50 to 1000 MHz.

To be more specific, if the only object was the reduction of the wavelength, such object can be achieved by mixing a material having a high dielectric constant into the resin material. The material having a high dielectric constant, however, is not sufficient in high-frequency characteristics, and the high-frequency characteristics should be improved by other means. If the material having a high dielectric constant, for example, $BaTiO_3$, $BaZrO_3$, or the like is used with a magnetic material having favorable high-frequency characteristics, for example, iron carbonyl, the resulting product will also exhibit desired properties in high-frequency region.

The electronic parts requiring such reduction in the wavelength and high-frequency characteristics include multilayer filter, balun transformer, dielectric filter, coupler, antenna, VCO (voltage controlled oscillator), RF (radio frequency) unit, and resonator.

Use of two or more materials is also preferable because, when one electric property is improved by incorporating a material, other insufficient electric properties can be compensated by incorporating other materials.

The electronic parts may be produced by using a multilayer substrate, for example, by forming electronic part devices by patterning at least the conductor layer of the multilayer substrate, forming throughholes which function as a terminal for each electronic part device, and cutting the substrate at the positions of the viahole into each electronic part device to thereby produce the multilayer electronic parts.

The multilayer electronic part of the present invention comprises a constituent layer which comprises a resin and at least one of a dielectric material and a magnetic material dispersed in the resin, and which does not include glass cloth. The constituent layer has a thickness of 2 to 40 μm.

Since the constituent layer does not include glass cloth, and has a thickness of up to 40 μm, the multilayer electronic part produced will have a reduced thickness.

Such constituent layer having a thickness of up to 40 μm can be formed by transferring the electrode layer using a release sheet. To be more specific, the constituent layer can be produced by attaching a copper foil on a transfer sheet, forming the pattern by etching, and transferring the patterned copper foil to a prepreg having a thickness of up to 40 μm. Since the pattering is accomplished by on a transfer sheet having the copper foil attached, the prepreg does not necessarily have the strength required for the etching and other steps, and formation of the conductor pattern on a prepreg as thin as 40 μm or less is enabled.

Use of the thus produced constituent layers has the following merits.

(1) Production of a multilayer electronic part and a multilayer circuit substrate which are small in size and excellent in performance, which has low specific weight and high processibility, and which is flexible is enabled.

(2) A highly functional multilayer electronic part can be produced with reduced risk of suffering from cracks, peeling, warp, and the like even when materials having different properties are laminated due to the high flexibility.

(3) Production is easy since no step of sintering, thick film printing, or the like is included, and designing of the trouble free production line is facilitated.

(4) By omitting the use of glass cloth, high reliability is achieved, and increase in the loading of the dielectric powder and magnetic powder is also enabled to realize high dielectric constant and high magnetic permeability.

(5) High pattern accuracy is realized since the pattern is formed by etching.

(6) Decrease in the lot-to-lot variation in the properties is enabled by omitting the use of the glass cloth.

(7) Strength can be easily improved by incorporating a layer including a glass cloth.

(8) A multilayer electronic part having an improved flame retardancy can be produced by adding a flame regarding agent.

The multilayer electronic parts of the invention find use as capacitors, coils (or inductors), filters, etc. Alternatively, by combining these elements with each other, or with wiring patterns, amplifier devices or functional devices, the electronic parts can form antennas, and high-frequency electronic parts such as superposed modules for use in high-frequency electronic circuits such as RF modules, voltage controlled oscillators, and power amplifiers, as well as optical pickups.

EXAMPLES

Experimental examples and working examples of the invention are given below by way of illustration and not by way of limitation.

Example 1

First, a sheet (prepreg) including no glass cloth was produced. A polyvinylbenzyl resin was used for the starting material, and the a mixture of the dielectric powder (68.45 g) and the resin (31.55 g) was blended in a ball mill. In this step, a coupling agent (a silane coupling agent) was also added by integral blending method.

The resulting slurry was made into a prepreg of 40 μm thick with no glass cloth by using a doctor blade.

Next a copper foil of 18 μm thick was adhered to a transfer film. A thermal release sheet (product name, Revalpha) manufactured by Nitto Denko (a polyester supporting layer with a thickness of 100 μm; adhesive layer with a thickness of 45 μm) was used for the transfer film. Adhesive strength of the thermal release sheet was 4.9 N/20 mm, and a pressure of 1 kg/mm was applied in the adhesion.

Next, a predetermined pattern was formed on the copper foil side of the prepreg by means of photolithography by immersing the prepreg in a ferric chloride etching solution (35% solution, temperature 20° C.) for about 10 to 15 minutes. Since the etching step is accomplished by means of photolithography, a fine pattern of about 30 to 36 μm could be clearly patterned.

Two sheets of the thermal transfer sheet having the patterned copper foil thereon were used. The prepreg produced as described above was sandwiched between these two sheets with the copper foil side facing inside, and the laminate was pressed at an elevated temperature under the conditions of 120° C., 30 minutes, and pressure of 1.5 MPa. After the pressing, the thermal release sheet was peeled off to obtain the prepreg having the copper foil on both sides.

The pressing of the laminate was conducted under different conditions to evaluate the state (result of the transfer) of the resulting substrate having the copper foil. The results are shown in Table 1. In the case of Sample No. 4–1, the patterned sheet became peeled off in the etching step due to the weak adhesion of the transfer film, and no further laminating procedure was conducted.

TABLE 1-1

| Sample No. | Adhesive strength before heating | N/20 cm² after heating | Peeling in the etching step | Temp. (° C.) | Heating time (min) | Pressure (MPa) | Result of Transfer |
|---|---|---|---|---|---|---|---|
| 1-1 | 6.9 | 0.049 | No | 120 | 120 | 9.8 | Poor transfer of the pattern |
| 1-2 | 6.9 | 0.049 | No | 140 | 120 | 9.8 | The pattern transferred is partly covered by the molten resin |
| 1-3 | 6.9 | 0.049 | No | 140 | 180 | 9.8 | Good |
| 1-4 | 6.9 | 0.049 | No | 160 | 120 | 4.9 | The pattern transferred is partly covered by the molten resin |
| 1-5 | 6.9 | 0.049 | No | 160 | 120 | 9.8 | Good |
| 1-6 | 6.9 | 0.049 | No | 160 | 120 | 20 | Good |
| 1-7 | 6.9 | 0.049 | No | 160 | 120 | 30 | Transfer of the adhesive layer |
| 1-8 | 6.9 | 0.049 | No | 160 | 180 | 9.8 | Good |
| 1-9 | 6.9 | 0.049 | No | 170 | 120 | 9.8 | Transfer of the adhesive layer |
| 2-1 | 4.9 | 0.049 | No | 120 | 120 | 9.8 | Poor transfer of the pattern |
| 2-2 | 4.9 | 0.049 | No | 140 | 120 | 9.8 | The pattern transferred is partly covered by the molten resin |
| 2-3 | 4.9 | 0.049 | No | 140 | 180 | 9.8 | Good |
| 2-4 | 4.9 | 0.049 | No | 160 | 120 | 4.9 | The pattern transferred is partly covered by the molten resin |
| 2-5 | 4.9 | 0.049 | No | 160 | 120 | 9.8 | Good |

TABLE 1-2

| Sample No. | Adhesive strength before heating | N/20 cm² after heating | Peeling in the etching step | Temp. (° C.) | Heating time (min) | Pressure (MPa) | Result of Transfer |
|---|---|---|---|---|---|---|---|
| 2-6 | 4.9 | 0.049 | No | 160 | 120 | 20 | Good |
| 2-7 | 4.9 | 0.049 | No | 160 | 120 | 30 | Transfer of the adhesive layer |
| 2-8 | 4.9 | 0.049 | No | 160 | 180 | 9.8 | Good |
| 2-9 | 4.9 | 0.049 | No | 170 | 120 | 9.8 | Transfer of the adhesive layer |
| 3-1 | 3.7 | 0.049 | No | 120 | 120 | 9.8 | Poor transfer of the pattern |
| 3-2 | 3.7 | 0.049 | No | 140 | 120 | 9.8 | The pattern transferred is partly covered by the molten resin |
| 3-3 | 3.7 | 0.049 | No | 140 | 180 | 9.8 | Good |
| 3-4 | 3.7 | 0.049 | No | 160 | 120 | 4.9 | The pattern transferred is partly covered by the molten resin |
| 3-5 | 3.7 | 0.049 | No | 160 | 120 | 9.8 | Good |
| 3-6 | 3.7 | 0.049 | No | 160 | 120 | 20 | Good |
| 3-7 | 3.7 | 0.049 | No | 160 | 120 | 30 | Transfer of the adhesive layer |
| 3-8 | 3.7 | 0.049 | No | 160 | 180 | 9.8 | Good |
| 3-9 | 3.7 | 0.049 | No | 170 | 120 | 9.8 | Transfer of the adhesive layer |
| 4-1 | 2.4 | 0.049 | Yes | — | — | — | Peeled off in the etching step |

Next, multilayer substrates were produced as described below by using a plurality of copper foil-clad prepregs produced by the same procedure as described above to form the predetermined circuit, and the prepregs to be disposed between such copper foil-clad prepregs. After placing these layers one on another, the laminate was pressed at an elevated temperature under the conditions including a temperature of 200° C., a period of 60 minutes, and pressure of 1.5 MPa. The resulting multilayer substrate was used in producing the electronic parts as described below. The conductors in the laminate was connected by an adequate method, for example by forming a through hole, an inner via hole, or the like.

Example 2

The sheet including no glass sheet produced in Example 1 was used to produce a multilayer substrate.

The transfer film used was a thermal release sheet (Intelimer Warm-off Type manufactured by Nitta K.K. which is a polyester supporting layer having a thickness of 100 $\mu$m having thereon an adhesive layer of about 25 to 30 $\mu$m thick), and to this transfer film was adhered a copper foil having a thickness of 18 $\mu$m. The adhesive strength of the thermal release sheet was 1.5 N/25 mm, and attachment was conducted at a pressure of 1 kg/mm$^2$.

Next, a predetermined pattern was formed on the surface of the copper foil-clad surface by means of photolithography by immersing in an etching solution containing ferric chloride (35% solution, temperature 40° C.) for about 10 to 15 minutes. Since the step of etching was conducted by means of a photolithographic technique, a fine pattern in the order of about 30 to 36 $\mu$m could be formed clearly.

Next, two thermal transfer sheets each having the patterned copper foil thereon were placed to sandwich the prepreg that had been produced as described above with the copper foil surface in the inside, and the laminate was pressed at an elevated temperature under the conditions including a temperature of 100° C., laminater speed of 0.1 m/min, and pressure of 1.0 MPa. After the pressing, the thermal release sheets were peeled off to obtain a prepreg having the copper foil on both surfaces.

Next, a laminate was prepared by using the thus produced patterned prepregs of predetermined design, a plurality of copper foil-clad prepregs produced by the same procedure as described above to form the predetermined circuit, and prepregs to be disposed between such copper foil-clad prepregs. The laminate was then pressed at an elevated temperature under the conditions including a temperature of 200° C., a period of 60 minutes, and a pressure of 1.5 MPa. The resulting multilayer substrate was used in producing the electronic parts as described below.

Example 3

Figure 3:
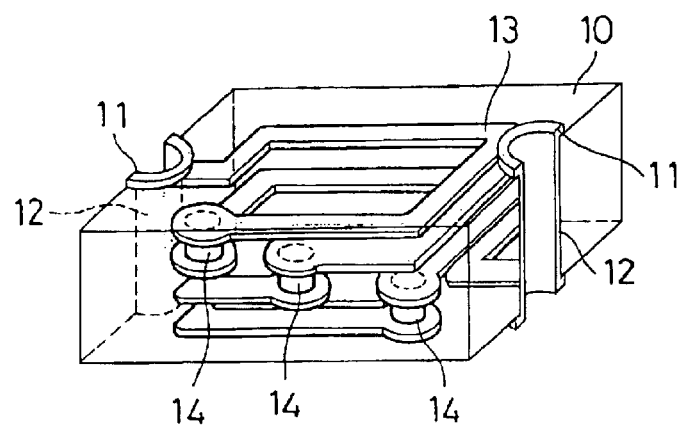
FIG. 3 illustrates an inductor as one exemplary electronic part of the invention.
Figure 4:
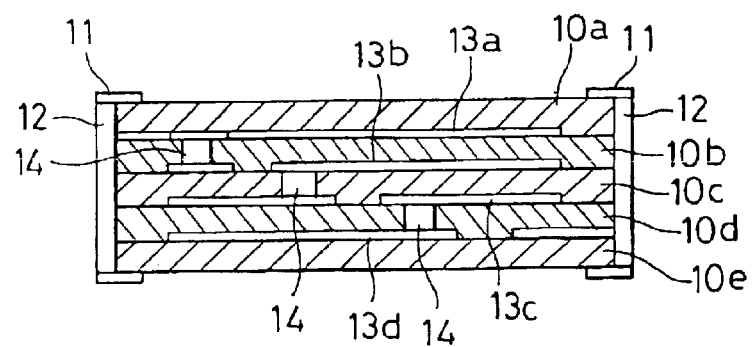
FIG. 4 illustrates an inductor as another exemplary electronic part of the invention.

FIGS. 3 and 4 illustrate an inductor. FIG. 3 is a see-through perspective view and FIG. 4 is a cross-sectional view.

In FIGS. 3 and 4, the inductor 10 includes constituent layers (prepregs or substrates) 10a to 10e of the resin materials of the invention, inner conductors (coil patterns) 13 formed on the constituent layers 10b to 10e, and via holes 14 for providing electrical connection to the inner conductors 13. Via holes 14 can be formed by drilling, laser machining, etching or the like. The ends of each coil formed are connected to through-vias 12 formed along end surfaces of the inductor 10 and land patterns 11 formed slightly above or below the through-vias 12. Through-via 12 has a half-cut structure by dicing or V-cutting. This is because when a plurality of devices are formed in a collective substrate which is eventually cut into discrete pieces along lines at the centers of through-vias 12.

At least one of the constituent layers 10a to 10e of the inductor 10 comprises a constituent layer having a thickness of 2 to 40 $\mu$m which does not include glass cloth. This constituent layer may further contain a dielectric powder and/or a magnetic powder for the purpose of adjusting the electronic and/or magnetic properties, and optionally, a flame retardant. All constituent layers may not necessarily comprise the same material, and constituent layers comprising different material may be used in combination. Some of the constituent layers may include glass cloth in order to improve the strength of the part.

For the purpose of producing a chip inductor having a large L value, the base substrate is required to have a high magnetic permeability. Similarly, an increased magnetic permeability is required for an increased impedance, when a bead is used as a countermeasure for EMC. Increase in the L value is also accomplished by reducing the layer to layer distance, namely, by using a thinner constituent layer to reduce the current leakage, and by increasing the number of turns without changing the shape. In view of such situation, a chip inductor of reduced size with high L value or high impedance can be produced by forming a constituent layer having a thickness of 2 to 40 $\mu$m which does not include glass cloth, and incorporating a dielectric powder for the purpose of adjusting the electronic and/or magnetic properties.

The constituent layers should preferably have a dielectric constant of 2.6 to 3.5 at 1 to 2 gigahertz because the distributed capacitance must be minimized for the potential application as a high-frequency chip inductor. Separately, for an inductor constructing a resonance circuit, the distributed capacitance is sometimes positively utilized. In such application, the constituent layers should preferably have a dielectric constant of 5 to 40 at 1 to 2 gigahertz. In this way, it becomes possible to reduce the size of device and eliminate capacitive elements. Also in these inductors, the material loss should be minimized. By setting the dielectric dissipation factor (tan δ) in the range of 0.0025 to 0.0075 at 1 to 2 gigahertz, an inductor having a minimized material loss and a high Q is obtainable. Further where a noise removing application is under consideration, the impedance must be maximized at the frequency of noise to be removed. For such application, a magnetic permeability of 3 to 20 at 1 to 2 gigahertz is appropriate, and use of the above-mentioned composite magnetic layers is preferred. This drastically improves the effect of removing high-frequency noise. The respective constituent layers may be identical or different, and an optimum combination thereof may be selected.

An equivalent circuit is shown in FIG. 12A. As seen from FIG. 12A, an multilayer electronic part (inductor) having a coil 31 is illustrated in the equivalent circuit.

Example 4

Figure 5:
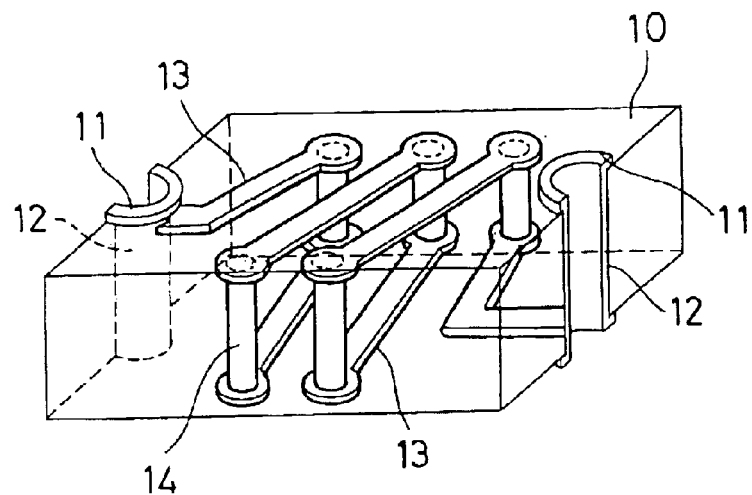
FIG. 5 illustrates an inductor as a further exemplary electronic part of the invention.
Figure 6:
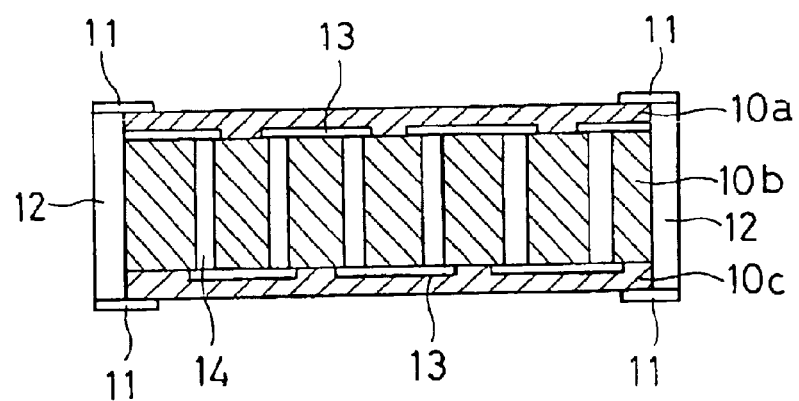
FIG. 6 illustrates an inductor as a still further exemplary electronic part of the invention.

FIGS. 5 and 6 illustrate another inductor. FIG. 5 is a see-through perspective view and FIG. 6 is a cross-sectional view.

In this example, the coil pattern which is wound and stacked in a vertical direction in Example 3 is changed to a helical coil which is wound in a lateral direction. The remaining components are the same as in Example 3. The same components are designated by like numerals and their description is omitted.

Example 5

Figure 7:
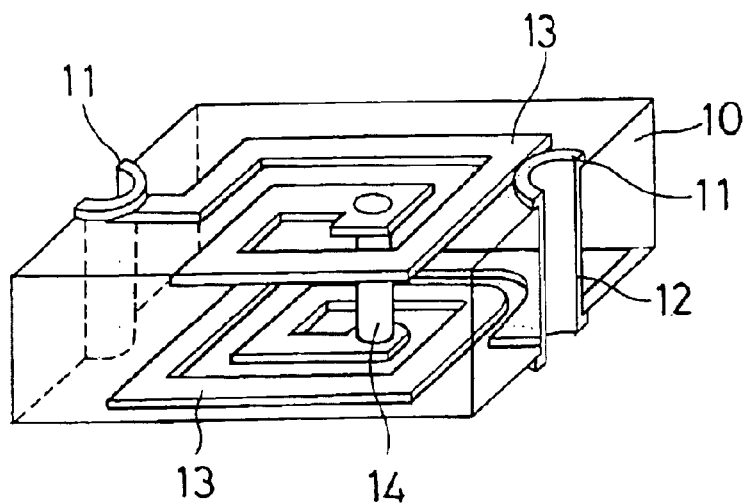
FIG. 7 illustrates an inductor as a yet further exemplary electronic part of the invention.
Figure 8:
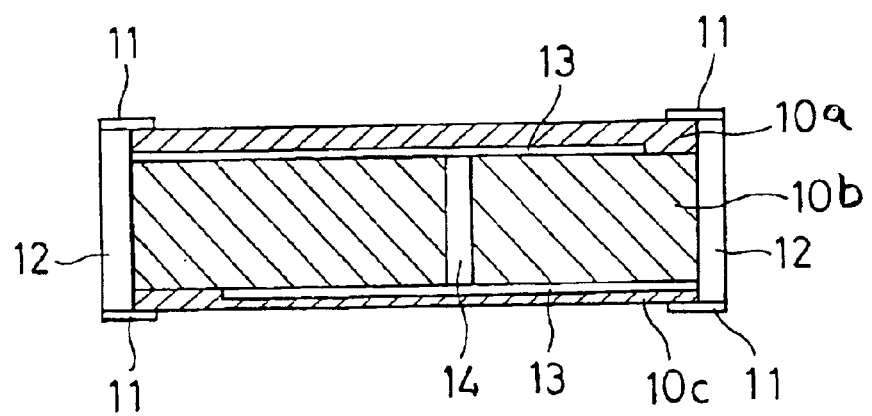
FIG. 8 illustrates an inductor as a yet further exemplary electronic part of the invention.

FIGS. 7 and 8 illustrate another inductor. FIG. 7 is a see-through perspective view and FIG. 8 is a cross-sectional view.

In this example, the coil pattern which is wound and stacked in a vertical direction in Example 3 is changed such that upper and lower spiral coils are connected. The remaining components are the same as in Example 3. The same components are designated by like numerals and their description is omitted.

Example 6

Figure 9:
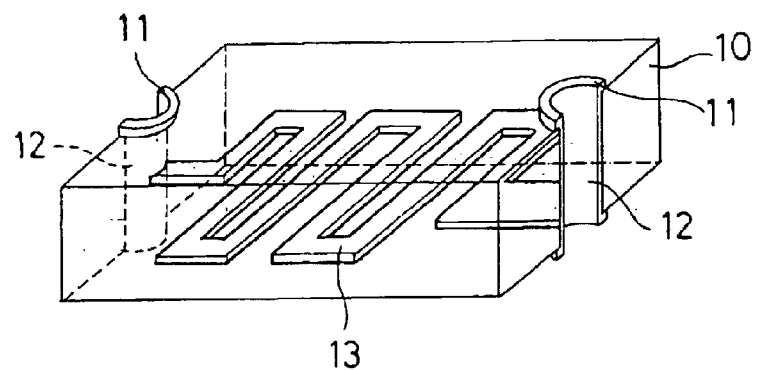
FIG. 9 illustrates an inductor as a yet further exemplary electronic part of the invention.
Figure 10:
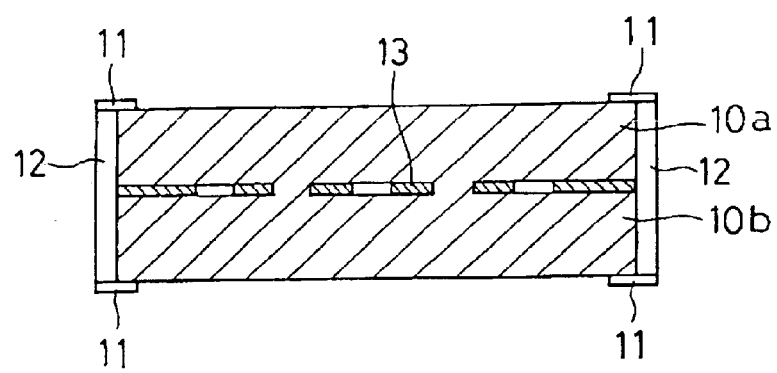
FIG. 10 illustrates an inductor as a yet further exemplary electronic part of the invention.

FIGS. 9 and 10 illustrate another inductor. FIG. 9 is a see-through perspective view and FIG. 10 is a cross-sectional view.

In this example, the coil pattern which is wound and stacked in a vertical direction in Example 3 is changed to an internal meander coil. The remaining components are the same as in Example 3. The same components are designated by like numerals and their description is omitted.

Example 7

Figure 11:
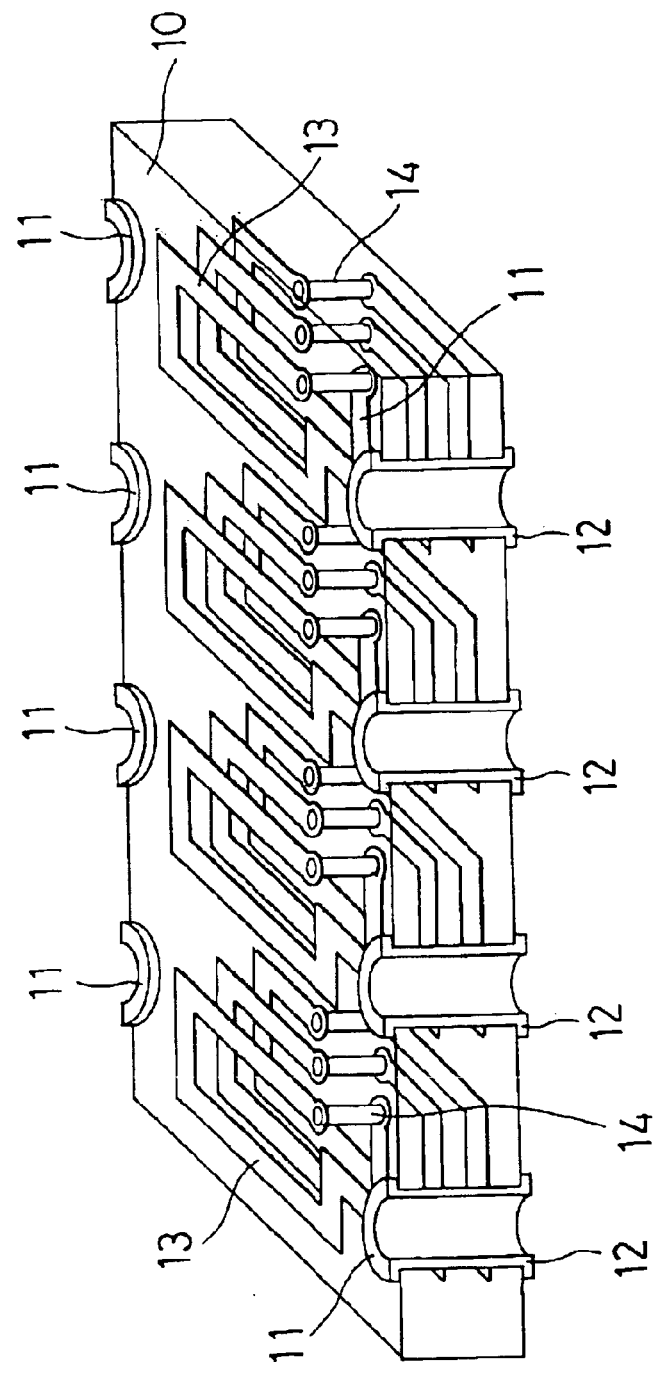
FIG. 11 illustrates an inductor as a yet further exemplary electronic part of the invention.

FIG. 11 is a see-through perspective view of another inductor.

In this example, the single coil in Example 3 is changed to an array of four juxtaposed coils. This array achieves a space saving. The remaining components are the same as in Example 3. The same components are designated by like numerals and their description is omitted. The equivalent circuit is shown in FIG. 12B. As shown in FIG. 12B, an multilayer electronic part (inductor) having four coils 31*a* to 31*d* is illustrated in the equivalent circuit.

Example 8

Figure 14:
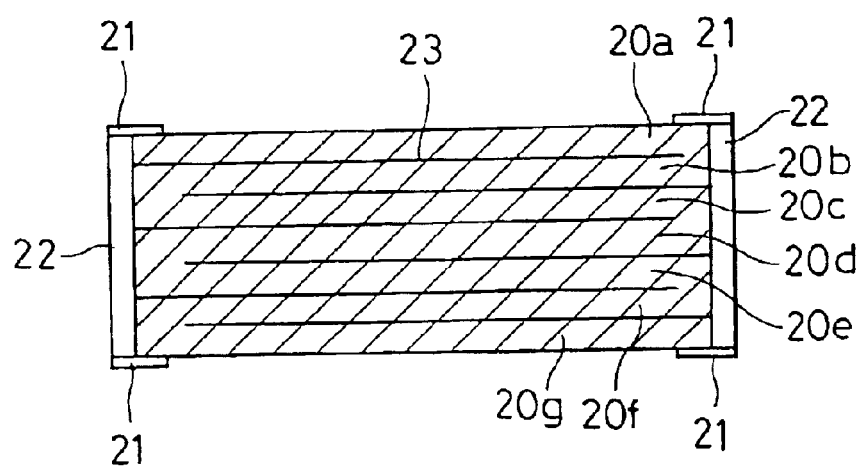
FIG. 14 illustrates a capacitor as another exemplary electronic part of the invention.

FIGS. 13 and 14 illustrate a capacitor. FIG. 13 is a see-through perspective view and FIG. 14 is a cross-sectional view.

In FIGS. 13 and 14, the capacitor 20 includes constituent layers (prepregs or substrates) 20*a* to 20*g* of resin materials of the present invention, inner conductors (internal electrode patterns) 23 formed on the constituent layers 20*b* to 20*g*, through-vias 22 formed along end surfaces of the capacitor and alternately connected to the inner conductors 23, and land patterns 21 formed slightly above or below the through-vias 22.

At least one of the constituent layers 20*a* to 20*g* of the capacitor 20 comprises a constituent layer having a thickness of 2 to 40 μm which does not include glass cloth. This constituent layer may further contain a dielectric powder and/or a magnetic powder for the purpose of adjusting the electronic and/or magnetic properties, and optionally, a flame retardant. All constituent layers may not necessarily comprise the same material, and constituent layers comprising different material may be used in combination. Some of the constituent layers may include glass cloth in order to improve the strength of the part.

In order to reduce the size of the chip capacitor, increase in the dielectric constant between the layers of counter electrodes is requited. In addition, a reduced layer to layer distance, namely, a thinner constituent layer is desirable for increasing the capacitance. In view of such situation, a chip capacitor of reduced size with high C value can be produced by forming a constituent layer having a thickness of 2 to 40 μm which does not include glass cloth, and incorporating a dielectric powder for the purpose of adjusting the electronic and/or magnetic properties.

The constituent layers should preferably have a dielectric constant of 2.6 to 40 and a dielectric dissipation factor of 0.0025 to 0.025 at 1 to 2 gigahertz when the diversity and precision of capacitance are considered. This enables to provide a wider range of capacitance and afford even a low capacitance at a high precision. It is also required that the material loss be minimized. By setting the dielectric dissipation factor (tan δ) in the range of 0.0025 to 0.025, a capacitor having a minimized material loss is obtainable. The respective constituent layers may be identical or different and an optimum combination thereof may be selected.

Figure 16A:
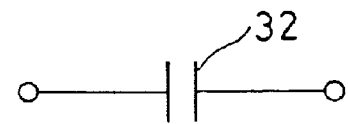
FIG. 16 is an equivalent circuit diagram of the capacitor which is an exemplary electronic part of the invention.

The equivalent circuit is shown in FIG. 16A. As shown in FIG. 16A, an multilayer electronic part (capacitor) having a capacitance 32 is illustrated in the equivalent circuit.

Example 9

Figure 15:
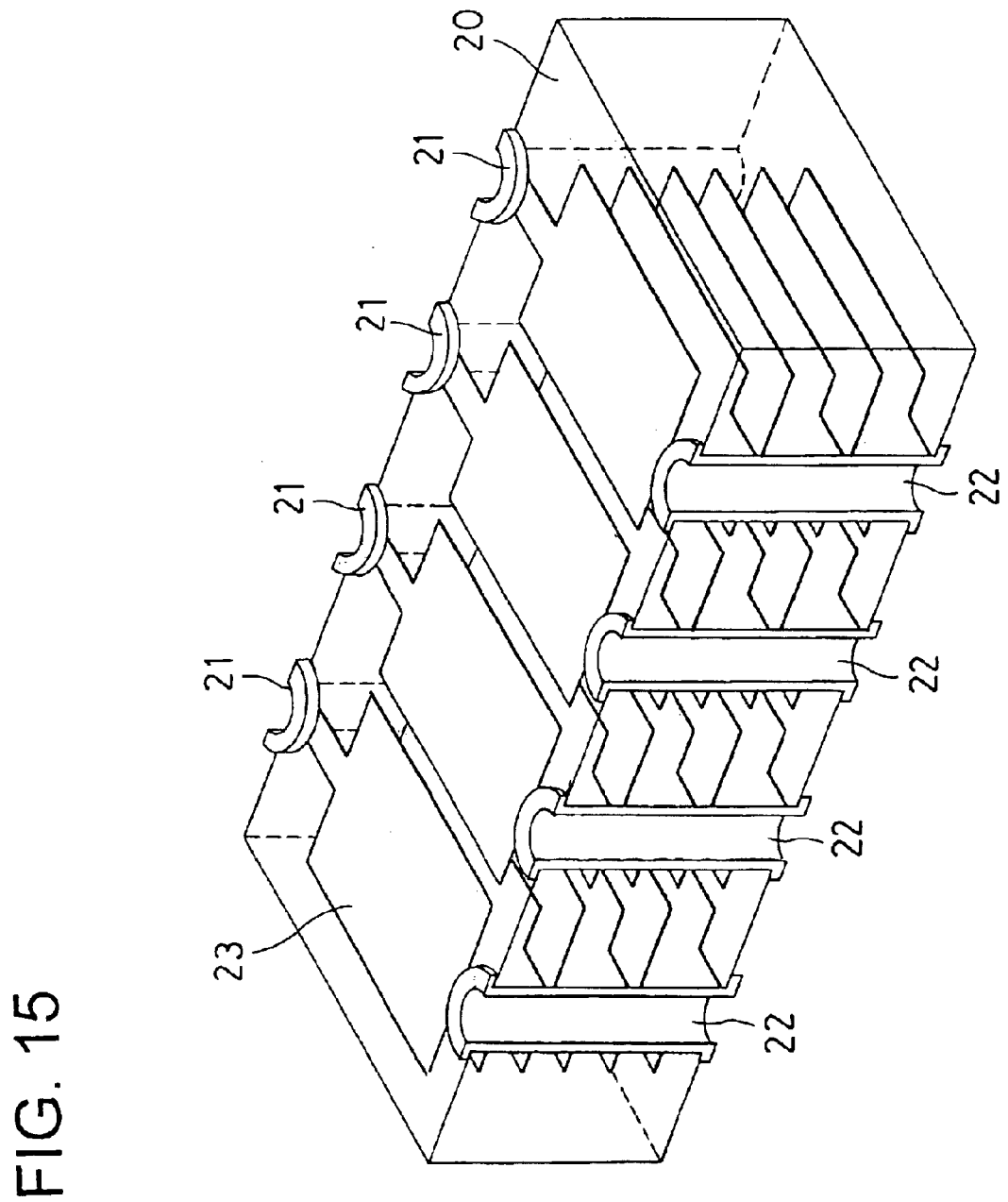
FIG. 15 illustrates a capacitor as a further exemplary electronic part of the invention.

FIG. 15 is a see-through perspective view of another capacitor.

Figure 16B:
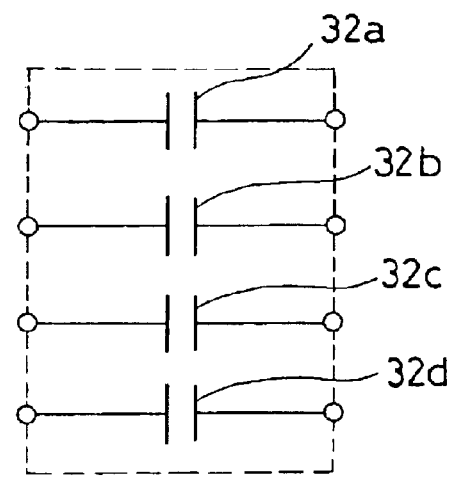

In this example, the single capacitor in Example 8 is changed to an array of four juxtaposed capacitors. When capacitors are formed in an array, it sometimes occurs to provide different capacitances at a high precision. To this end, the above-mentioned ranges of dielectric constant and dielectric dissipation factor are preferable. The remaining components are the same as in Example 8. The same components are designated by like numerals and their description is omitted. The equivalent circuit is shown in FIG. 16B. As shown in FIG. 16B, a multilayer electronic part (capacitor array) having four capacitors 32*a* to 32*d* is illustrated in the equivalent circuit.

Example 10

Figure 17:
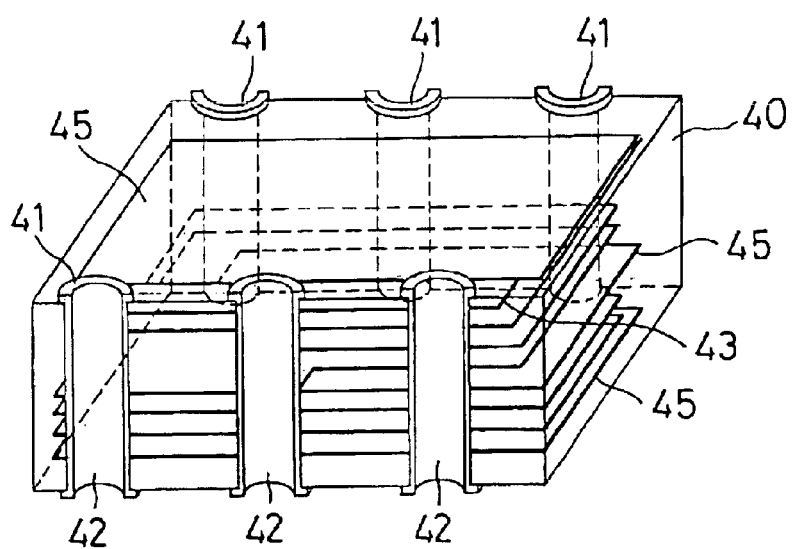
FIG. 17 illustrates a balun transformer as one exemplary electronic part of the invention.
Figure 18:
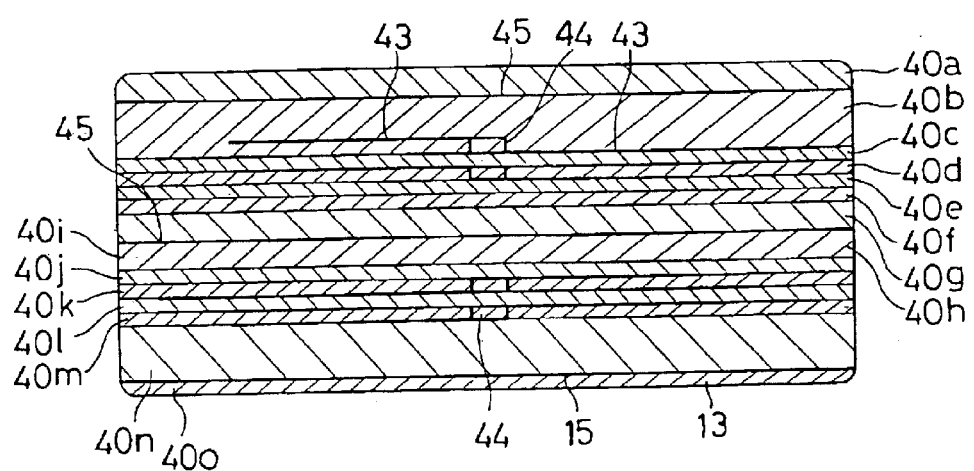
FIG. 18 illustrates a balun transformer as another exemplary electronic part of the invention.
Figure 19:
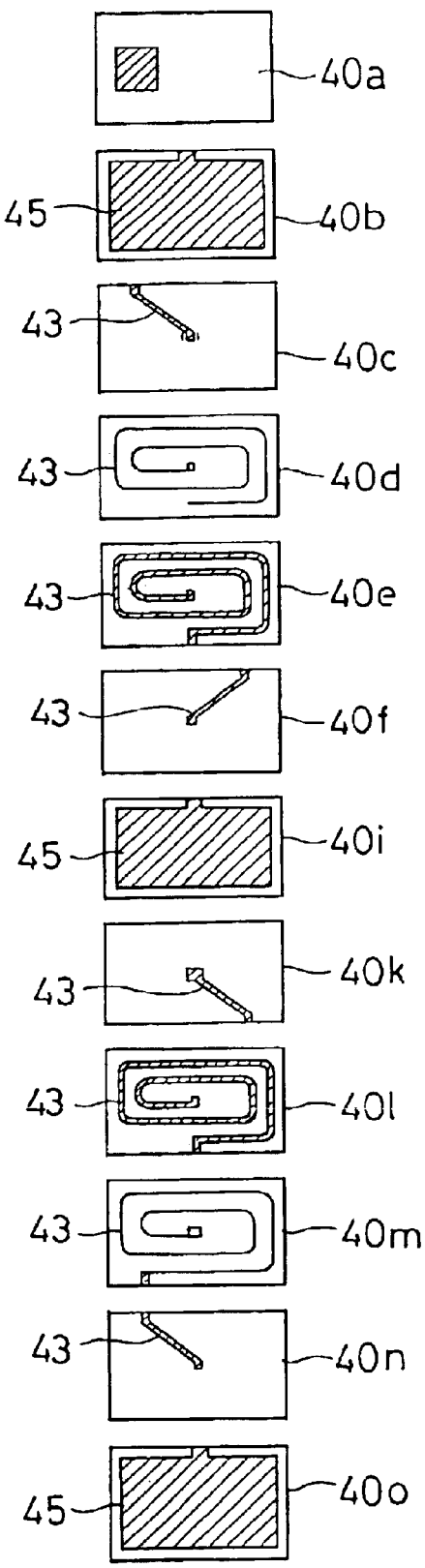
FIG. 19 illustrates a balun transformer as a further exemplary electronic part of the invention.
Figure 20:
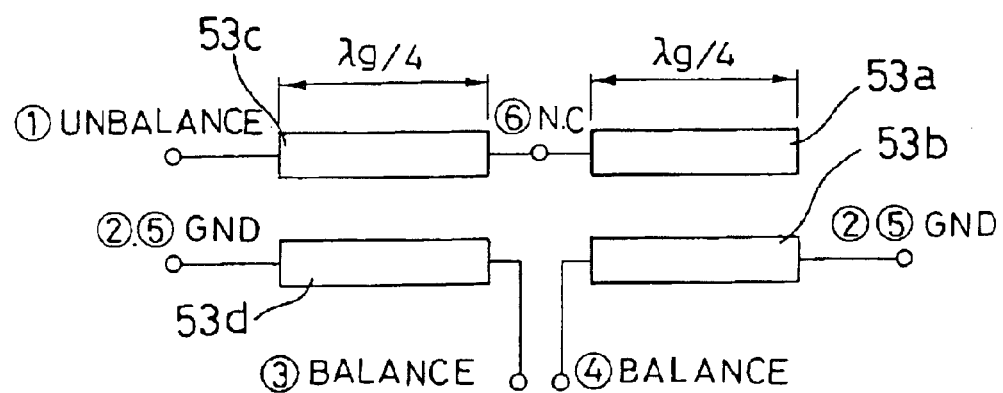
FIG. 20 is an equivalent circuit diagram of the balun transformer which is an exemplary electronic part of the invention.

FIGS. 17 to 20 illustrate a balun transformer. FIG. 17 is a see-through perspective view, FIG. 18 is a cross-sectional view, FIG. 19 is an exploded plan view of respective constituent layers, and FIG. 20 is an equivalent circuit diagram.

In FIGS. 17 to 19, the balun transformer 40 includes a stack of constituent layers 40*a* to 40*o*, internal GND conductors 45 disposed above, below and intermediate the stack, and inner conductors 43 formed between the internal GND conductors 45. The inner conductors 43 are spiral conductor sections 43 having a length of $\lambda g/4$ which are connected by via holes 44 so as to construct coupling lines 53*a* to 53*d* as shown in the equivalent circuit of FIG. 20.

At least one of the constituent layers 40*a* to 40*o* of the balun transformer 40 comprises a constituent layer having a thickness of 2 to 40 μm which does not include glass cloth. This constituent layer may further contain a dielectric powder and/or a magnetic powder for the purpose of adjusting the electronic and/or magnetic properties, and optionally, a flame retardant. All constituent layers may not necessarily comprise the same material, and constituent layers comprising different material may be used in combination. Some of the constituent layers may include glass cloth in order to improve the strength of the part.

For the purpose of designing the balun transformer of reduced size, a higher dielectric constant is desirable. Similarly, a reduced layer to layer distance, namely, a thinner constituent layer is desirable. In view of such situation, a balun transformer of reduced size with high performance can be produced by forming a constituent layer having a thickness of 2 to 40 µm which does not include glass cloth, and incorporating a dielectric powder for the purpose of adjusting the electronic and/or magnetic properties.

The constituent layers may preferably have a dielectric constant of 2.6 to 40 and a dielectric dissipation factor (tan δ) of 0.0025 to 0.025 at 1 to 2 gigahertz in some applications. In other applications, a magnetic permeability of 3 to 20 at 1 to 2 gigahertz may be appropriate. The respective constituent layers may be identical or different and an optimum combination thereof may be selected.

Example 11

Figure 21:
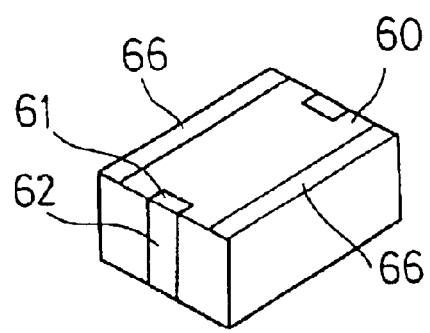
FIG. 21 illustrates a multilayer filter as one exemplary electronic part of the invention.
Figure 22:
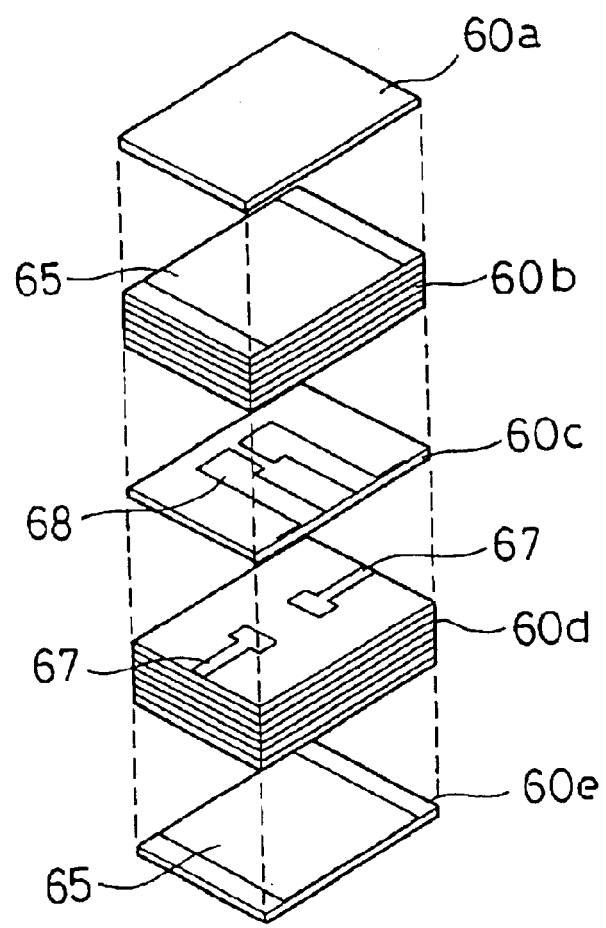
FIG. 22 illustrates a multilayer filter as another exemplary electronic part of the invention.
Figure 23:
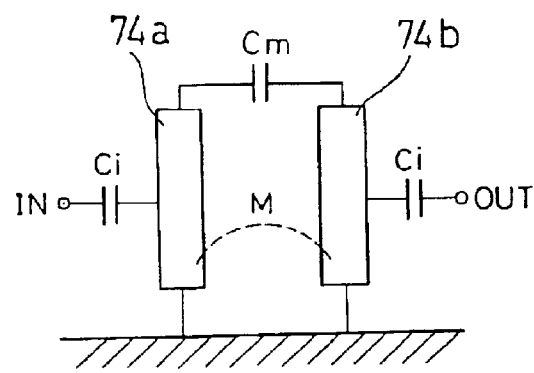
FIG. 23 is an equivalent circuit diagram of the multilayer filter which is an exemplary electronic part of the invention.
Figure 24:
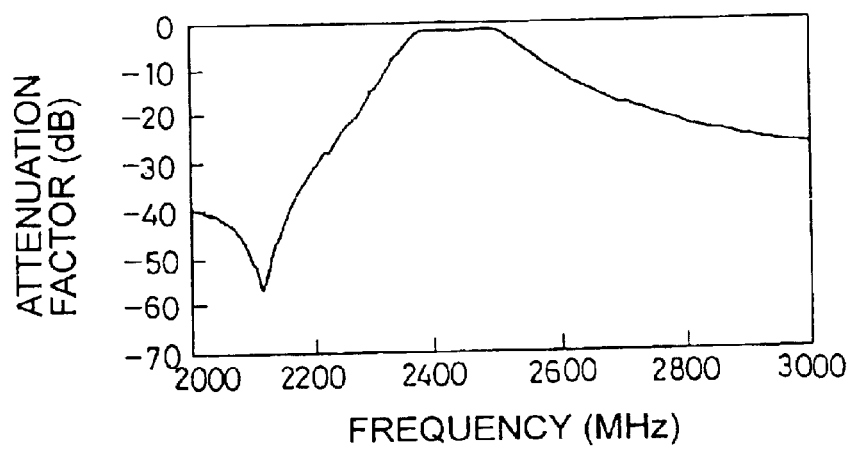
FIG. 24 is a graph showing transmission characteristics of the multilayer filter which is an exemplary electronic part of the invention.

FIGS. 21 to 24 illustrate a multilayer filter. FIG. 21 is a perspective view, FIG. 22 is an exploded perspective view, FIG. 23 is an equivalent circuit diagram, and FIG. 24 is a transmission diagram. The multilayer filter is constructed as having two poles.

In FIGS. 21 to 23, the multilayer filter 60 includes a stack of constituent layers 60a to 60e, a pair of strip lines 68 and a pair of capacitor conductors 67 both disposed approximately at the center of the stack. The capacitor conductors 67 are formed on a lower constituent layer group 60d, and the strip lines 68 are formed on a constituent layer 60c thereon. GND conductors 65 are formed on upper and lower end surfaces of the constituent layers 60a to 60e so that the strip lines 68 and capacitor conductors 67 are interleaved therebetween. The strip lines 68, capacitor conductors 67 and GND conductors 65 are connected to end electrodes (external terminals) 62 formed on end sides and land patterns 61 formed slightly above or below the end electrodes 62. GND patterns 66 which are formed on opposite sides and slightly above or below therefrom are connected to GND conductors 65.

The strip lines 68 are strip lines 74a, 74b having a length of λg/4 or shorter as shown in the equivalent circuit of FIG. 23. The capacitor conductors 67 constitute input and output coupling capacitances Ci. The strip lines 74a and 74b are coupled by a coupling capacitance Cm and a coupling coefficient M. Such an equivalent circuit indicates the implementation of a multilayer filter having transmission characteristics of the two pole type as shown in FIG. 24.

At least one of the constituent layers 60a to 60e of the multilayer filter 60 comprises a constituent layer having a thickness of 2 to 40 µm which does not include glass cloth. This constituent layer may further contain a dielectric powder and/or a magnetic powder for the purpose of adjusting the electronic and/or magnetic properties, and optionally, a flame retardant. All constituent layers may not necessarily comprise the same material, and constituent layers comprising different material may be used in combination. Some of the constituent layers may include glass cloth in order to improve the strength of the part.

For the purpose of designing the multilayer filter of reduced size, a higher dielectric constant is desirable. Similarly, a reduced layer to layer distance, namely, a thinner constituent layer is desirable. In view of such situation, a multilayer filter of reduced size with high performance can be produced by forming a constituent layer having a thickness of 2 to 40 µm which does not include glass cloth, and incorporating a dielectric powder for the purpose of adjusting the electronic and/or magnetic properties.

The multilayer filter exhibits desired transmission characteristics in a frequency band of several hundreds of megahertz to several gigahertz when the constituent layers have a dielectric constant of 2.6 to 40 at 1 to 2 gigahertz. It is desired to minimize the material loss of the strip line resonator, and hence, setting a dielectric dissipation factor (tan δ) in the range of 0.0025 to 0.0075 at 1 to 2 gigahertz is preferable.

Example 12

Figure 25:
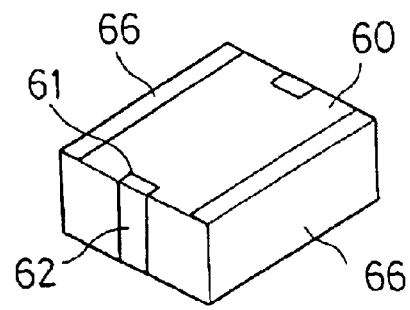
FIG. 25 illustrates a multilayer filter as one exemplary electronic part of the invention.
Figure 26:
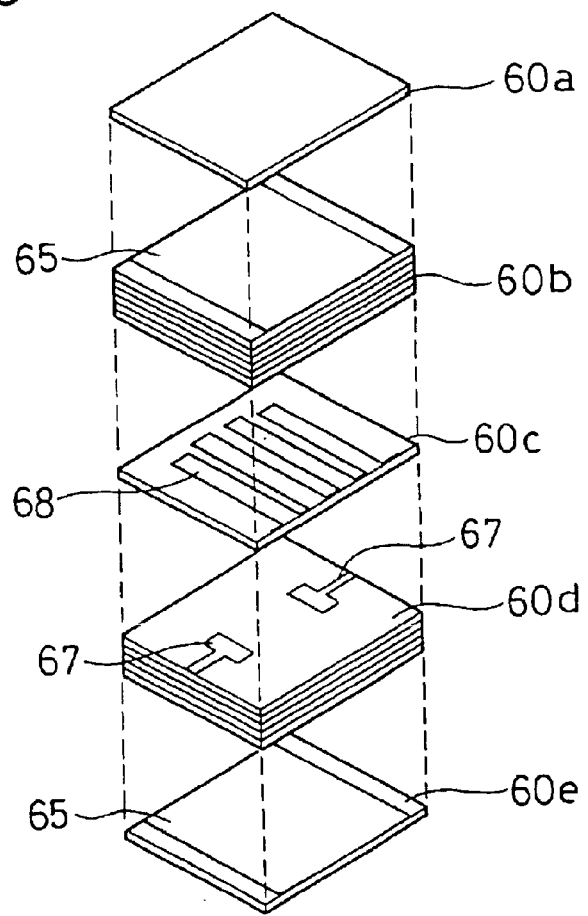
FIG. 26 illustrates a multilayer filter as another exemplary electronic part of the invention.
Figure 27:
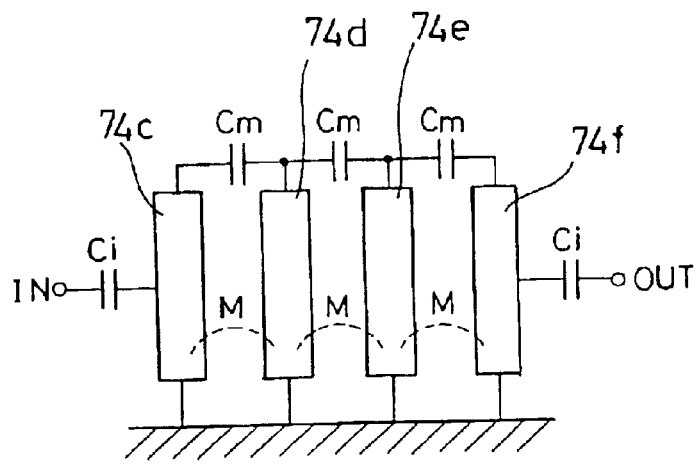
FIG. 27 is an equivalent circuit diagram of the multilayer filter which is an exemplary electronic part of the invention.
Figure 28:
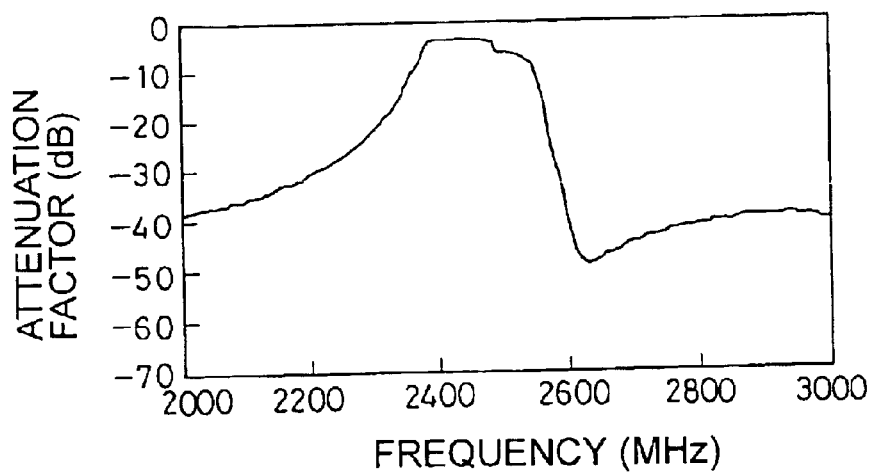
FIG. 28 is a graph showing transmission characteristics of the multilayer filter which is an exemplary electronic part of the invention.

FIGS. 25 to 28 illustrate another multilayer filter. FIG. 25 is a perspective view, FIG. 26 is an exploded perspective view, FIG. 27 is an equivalent circuit diagram, and FIG. 28 is a transmission diagram. The multilayer filter is constructed as having four poles.

In FIGS. 25 to 27, the multilayer filter 60 includes a stack of constituent layers 60a to 60e, four strip lines 68 and a pair of capacitor conductors 67 both disposed approximately at the center of the stack. The remaining components are the same as in Example 11. The same components are designated by like numerals and their description is omitted.

Example 13

Figure 29:
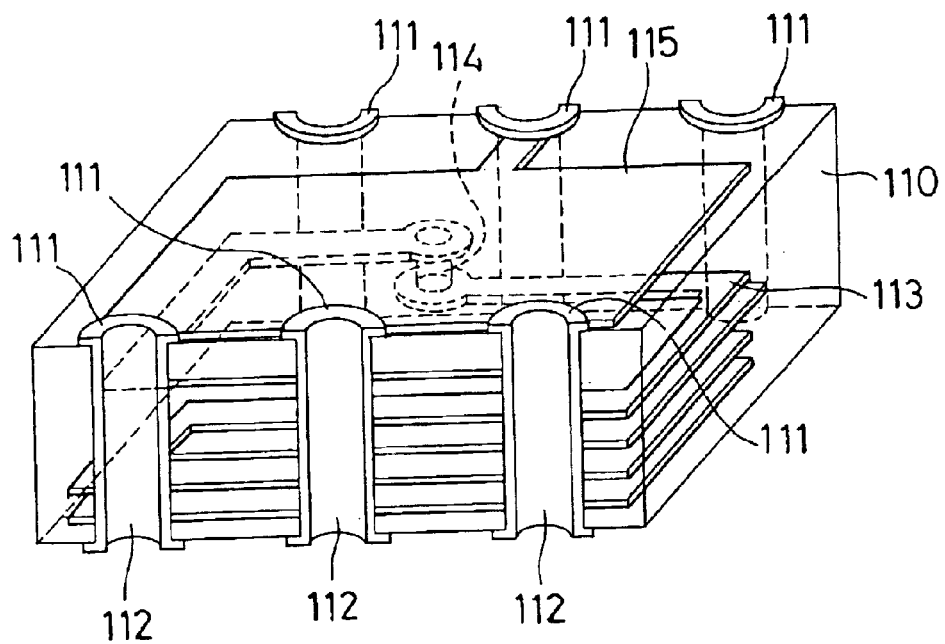
FIG. 29 illustrates a coupler as one exemplary electronic part of the invention.
Figure 30:
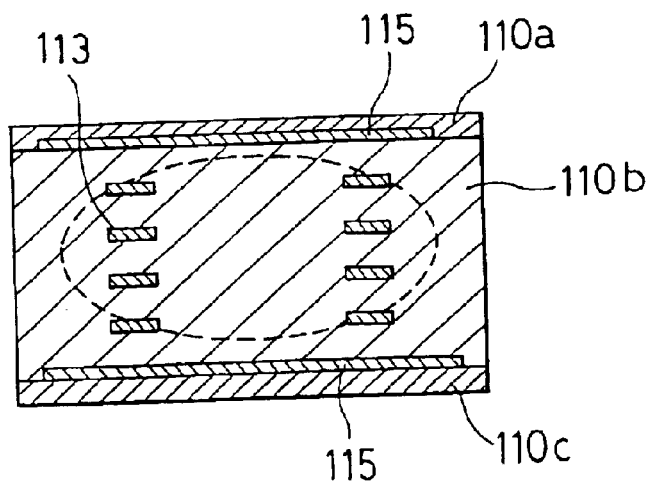
FIG. 30 illustrates a coupler as another exemplary electronic part of the invention.
Figure 31:
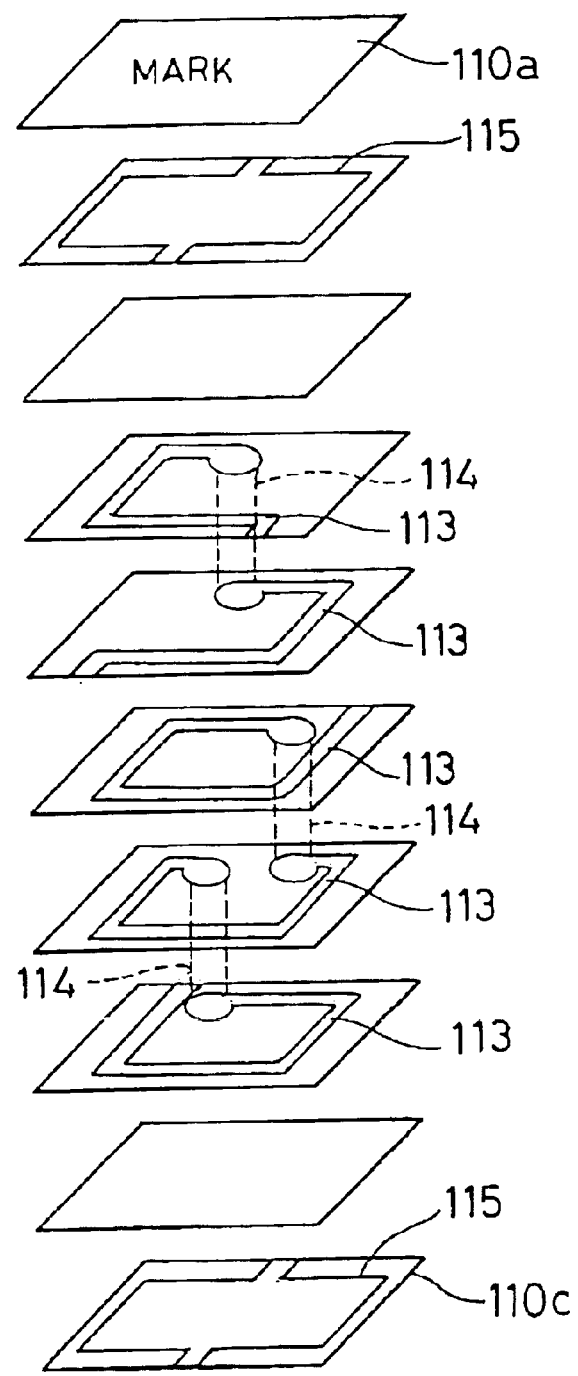
FIG. 31 illustrates a coupler as a further exemplary electronic part of the invention.
Figure 32:
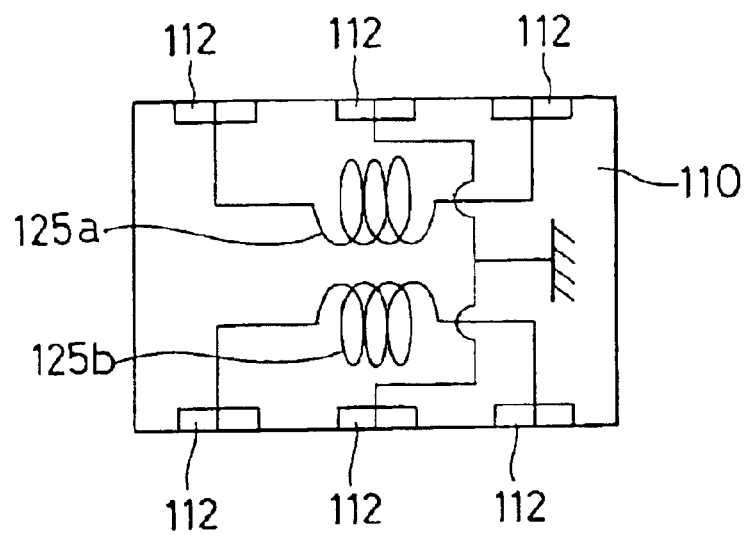
FIG. 32 illustrates the internal connections of the coupler which is an exemplary electronic part of the invention.
Figure 33:
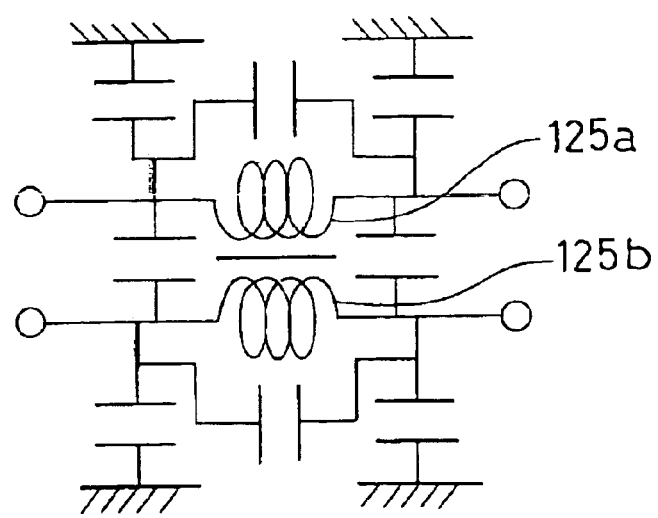
FIG. 33 is an equivalent circuit diagram of the coupler which is an exemplary electronic part of the invention.

FIGS. 29 to 33 illustrate a coupler. FIG. 29 is a perspective view, FIG. 30 is a cross-sectional view, FIG. 31 is an exploded perspective view of respective constituent layers, FIG. 32 is a diagram of internal connection, and FIG. 33 is an equivalent circuit diagram.

In FIGS. 29 to 33, the coupler 110 includes a stack of constituent layers 110a to 110c, internal GND conductors 115 formed and disposed on the top and bottom of the stack, and inner conductors 113 formed between the internal GND conductors 115. The inner conductors 113 are connected by via holes 114 in a spiral fashion so that two coils construct a transformer. Ends of the thus formed coils and internal GND conductors 115 are connected to through-vias 112 formed on end sides and land patterns 111 formed slightly above or below the through-vias 112 as shown in FIG. 32. With the above construction, a coupler 110 having two coils 125a and 125b coupled is obtained as shown in the equivalent circuit diagram of FIG. 33.

At least one of the constituent layers 110a to 110c of the coupler 110 comprises a constituent layer having a thickness of 2 to 40 µm which does not include glass cloth. This constituent layer may further contain a dielectric powder and/or a magnetic powder for the purpose of adjusting the electronic and/or magnetic properties, and optionally, a flame retardant. All constituent layers may not necessarily comprise the same material, and constituent layers comprising different material may be used in combination. Some of the constituent layers may include glass cloth in order to improve the strength of the part.

For the purpose of designing the coupler of reduced size, a higher dielectric constant is desirable. Similarly, a reduced layer to layer distance, namely, a thinner constituent layer is desirable. In view of such situation, a coupler of reduced size with high performance can be produced by forming a constituent layer having a thickness of 2 to 40 µm which does not include glass cloth, and incorporating a dielectric powder for the purpose of adjusting the electronic and/or magnetic properties. Where a wide band is to be realized, the constituent layers should preferably have a minimized dielectric constant.

Depending on the intended application, required performance and specifications, a material having an appropriate dielectric constant may be used. In most cases, setting a dielectric constant in the range of 2.6 to 40 at 1 to 2 gigahertz ensures desired transmission characteristics in a band of several hundreds of megahertz to several gigahertz. For increasing the Q value of an internal inductor, a dielectric dissipation factor (tan δ) of 0.0025 to 0.0075 at 1 to 2 gigahertz is preferable. This choice enables to form an inductor having a minimized material loss and a high Q value, leading to a high performance coupler.

Example 14

Figure 34:
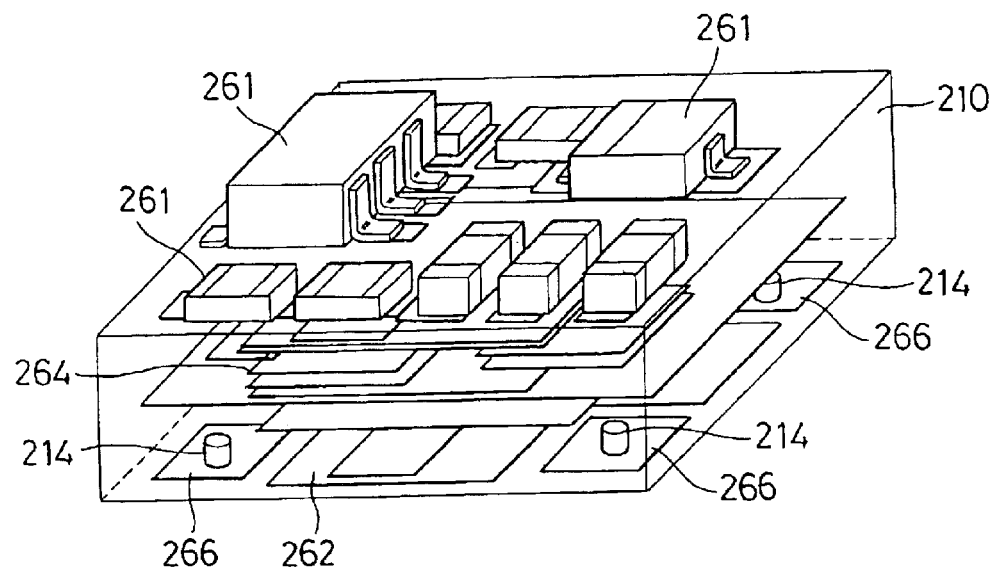
FIG. 34 illustrates a VCO as one exemplary electronic part of the invention.
Figure 35:
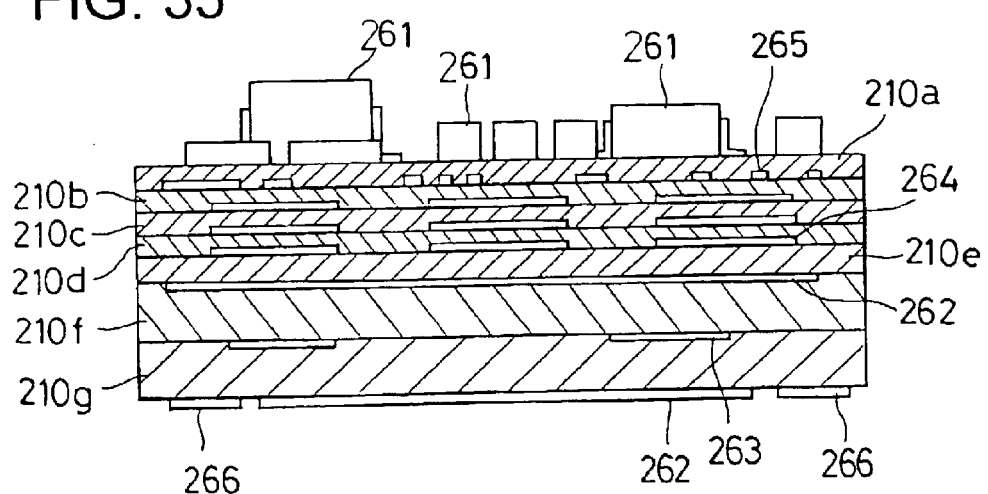
FIG. 35 illustrates a VCO as another exemplary electronic part of the invention.
Figure 36:
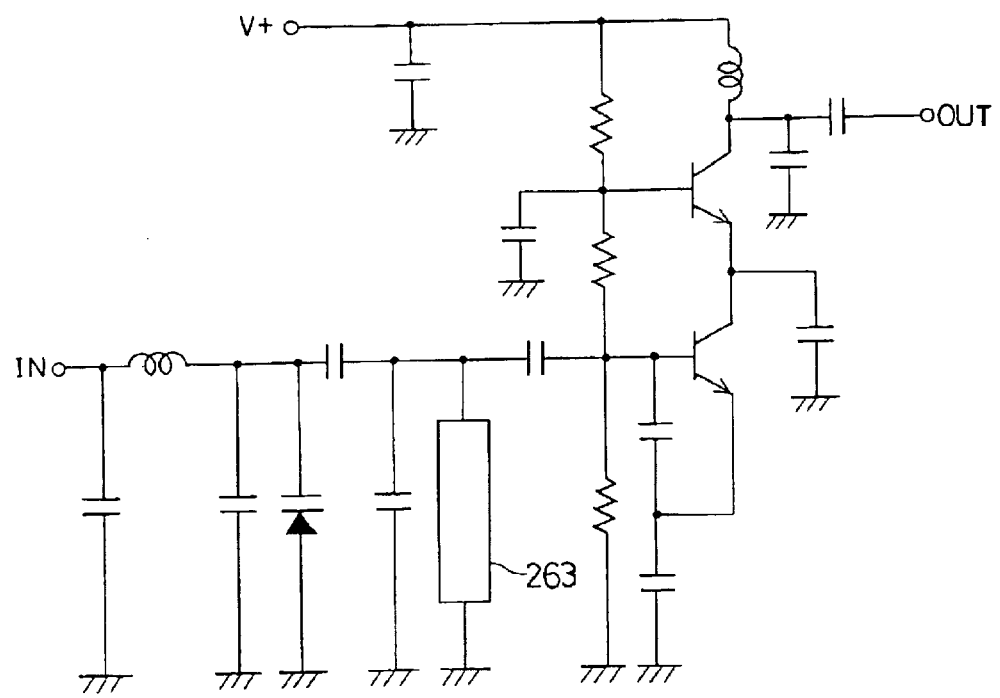
FIG. 36 is an equivalent circuit diagram of the VCO which is an exemplary electronic part of the invention.

FIGS. 34 to 36 illustrate a voltage controlled oscillator (VCO). FIG. 34 is a see-through perspective view, FIG. 35 is a cross-sectional view, and FIG. 36 is an equivalent circuit diagram.

In FIGS. 34 to 36, the VCO includes a stack of constituent layers 210a to 210g, electronic parts 261 disposed and formed on the stack including capacitors, inductors, semiconductors and registers, and conductor patterns 262, 263, 264 formed above, below and intermediate the constituent layers 210a to 210g. Since the VCO is constructed to an equivalent circuit as shown in FIG. 36, it further includes strip lines 263, capacitors, signal lines, semiconductors and power supply lines. It is advantageous to form the respective constituent layers from materials selected appropriate for their function.

In this example, at least one of the constituent layers 210a to 210g comprises a constituent layer having a thickness of 2 to 40 μm which does not include glass cloth. This constituent layer may further contain a dielectric powder and/or a magnetic powder for the purpose of adjusting the electronic and/or magnetic properties, and optionally, a flame retardant. All constituent layers may not necessarily comprise the same material, and constituent layers comprising different material may be used in combination. Some of the constituent layers may include glass cloth in order to improve the strength of the part.

When the constituent layer including no glass cloth as described above is used for the constituent layers 210c to 210e constructing a capacitor, the thickness of the constituent layer can be drastically reduced and production of a VCO with reduced size is enabled.

For the constituent layers 210f, 210g constructing a resonator, it is preferred to use constituent layers having a dielectric dissipation factor of 0.0025 to 0.0075 at 1 to 2 gigahertz. For the constituent layers 210c to 210e constructing a capacitor, it is preferred to use constituent layers so as to give a dielectric dissipation factor of 0.0075 to 0.025 and a dielectric constant of 5 to 40 at 1 to 2 gigahertz. For wiring and the constituent layers 210a, 210b constructing an inductor, it is preferred to use dielectric layers having a dielectric dissipation factor of 0.0025 to 0.0075 and a dielectric constant of 2.6 to 5.0 at 1 to 2 gigahertz.

On the surface of constituent layers 210a to 210g, there are provided inner conductors including strip line 263, GND conductor 262, capacitor conductor 264, wiring inductor conductor 265 and terminal conductor 266. Upper and lower inner conductors are connected by via holes 214. Electronic parts 261 are mounted on the surface, completing a VCO corresponding to the equivalent circuit of FIG. 36.

This construction enables to provide an appropriate dielectric constant, Q and dielectric dissipation factor for a distinct function, arriving at a high performance, small size, and thin part.

Example 15

Figure 37:
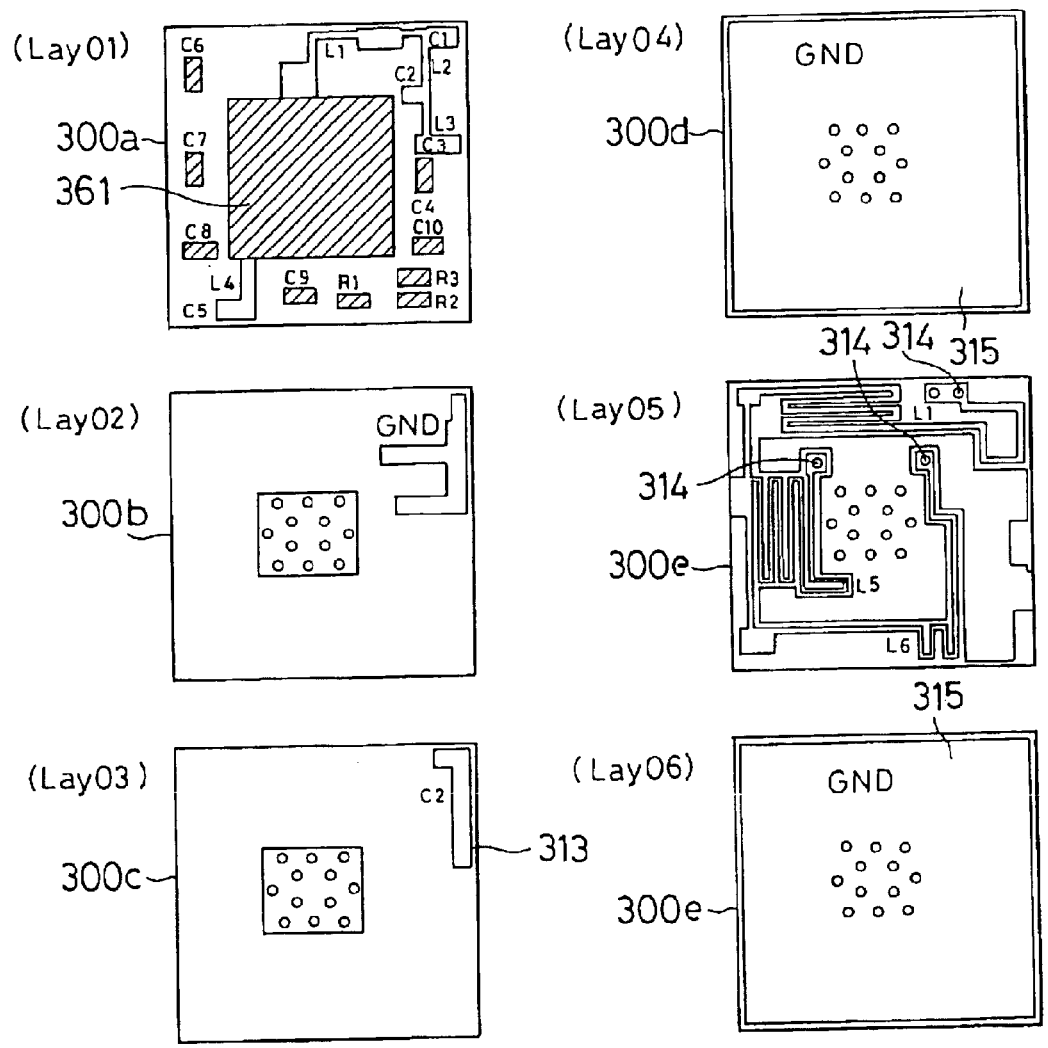
FIG. 37 illustrate a power amplifier as one exemplary electronic part of the invention.
Figure 38:
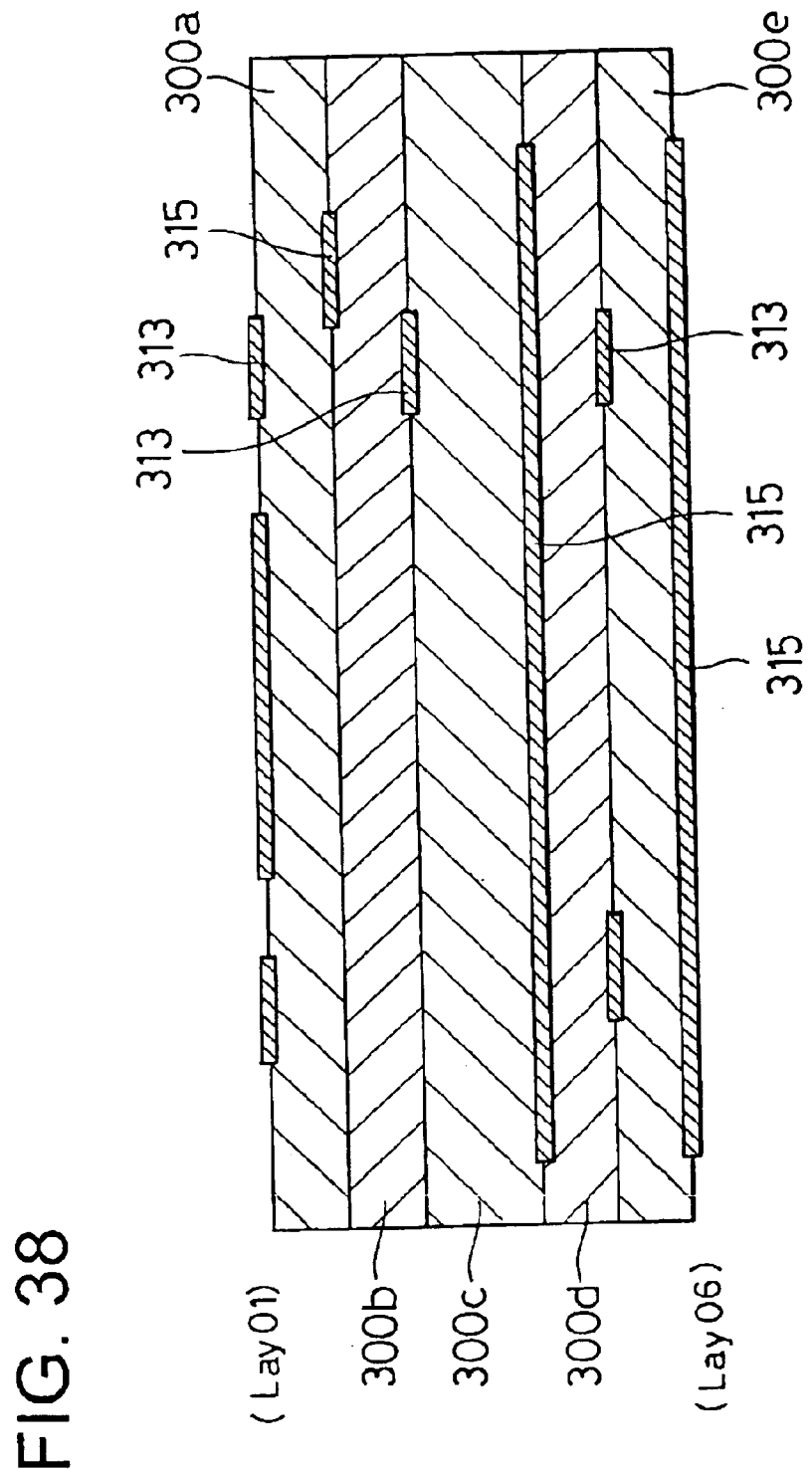
FIG. 38 illustrate a power amplifier as another exemplary electronic part of the invention.
Figure 39:
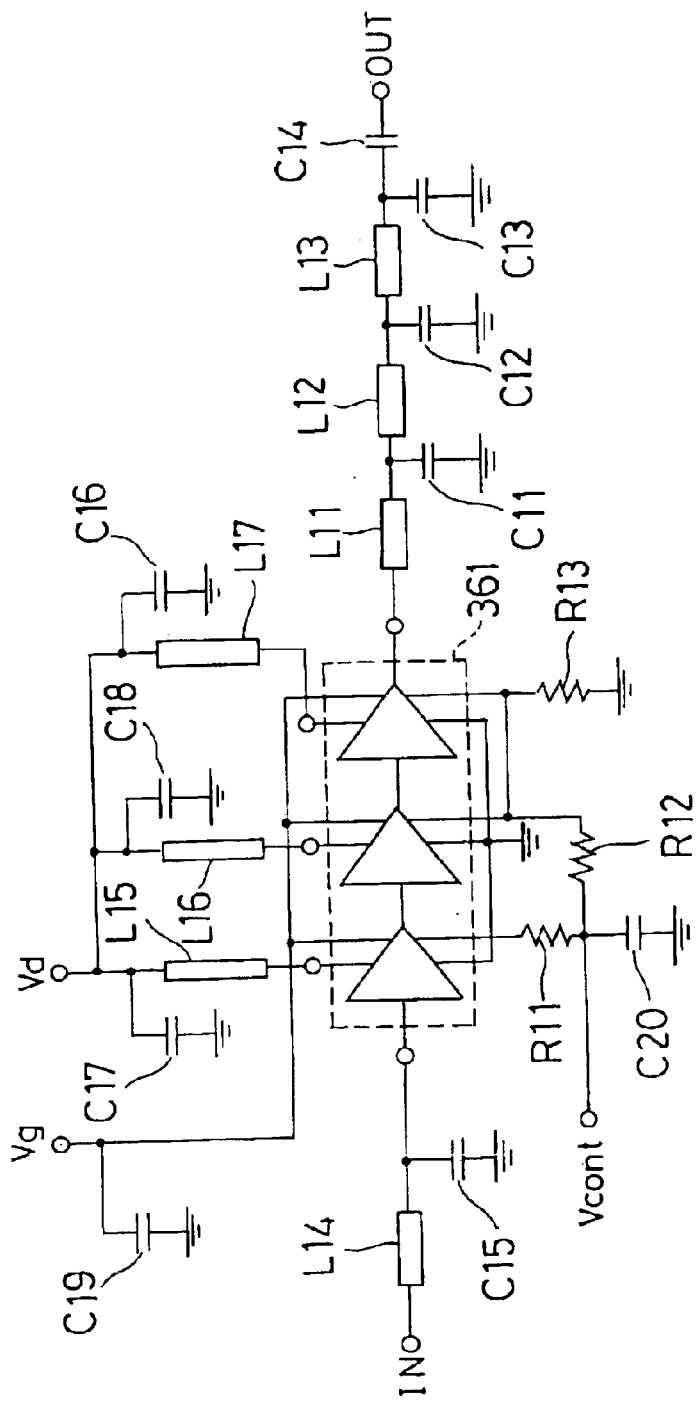
FIG. 39 is an equivalent circuit diagram of the power amplifier which is an exemplary electronic part of the invention.

FIGS. 37 to 39 illustrate a power amplifier. FIG. 37 is an exploded plan view of respective constituent layers, FIG. 38 is a cross-sectional view, and FIG. 39 is an equivalent circuit diagram.

In FIGS. 37 to 39, the power amplifier includes a stack of constituent layers 300a to 300e, electronic parts 361 formed thereon including capacitors, inductors, semiconductors and registers, and conductor patterns 313, 315 formed above, below and intermediate the constituent layers 300a to 300e. Since the power amplifier is constructed to an equivalent circuit as shown in FIG. 39, it further includes strip lines L11 to L17, capacitors C11 to C20, signal lines, and power supply lines to semiconductor devices. It is advantageous to form the respective constituent layers from materials selected appropriate for their function.

In this example, at least one of the constituent layers comprises a constituent layer having a thickness of 2 to 40 μm which does not include glass cloth. This constituent layer may further contain a dielectric powder and/or a magnetic powder for the purpose of adjusting the electronic and/or magnetic properties, and optionally, a flame retardant. All constituent layers may not necessarily comprise the same material, and constituent layers comprising different material may be used in combination. Some of the constituent layers may include glass cloth in order to improve the strength of the part.

When the constituent layer including no glass cloth as described above is used for the constituent layers 300a to 300c constructing a capacitor, the thickness of the constituent layer can be drastically reduced and production of a power amplifier with reduced size is enabled.

For the constituent layers 300d, 300e constructing strip lines in this example, it is preferred to use constituent layers having a dielectric dissipation factor of 0.0075 to 0.025 and a dielectric constant of 2.6 to 40 at 1 to 2 gigahertz. For the constituent layers 300a to 300c constructing a capacitor, it is preferred to use constituent layers so as to give a dielectric dissipation factor of 0.0025 to 0.025 and a dielectric constant of 5 to 40.

On the surface of constituent layers 300a to 300e, there are provided inner conductors 313, GND conductors 315, and the like. Upper and lower inner conductors are connected by via holes 314. Electronic parts 361 are mounted on the surface, completing a power amplifier corresponding to the equivalent circuit of FIG. 39.

This construction enables to provide an appropriate dielectric constant, Q and dielectric dissipation factor for a distinct function, arriving at a high performance, small size, and thin part.

Example 16

Figure 40:
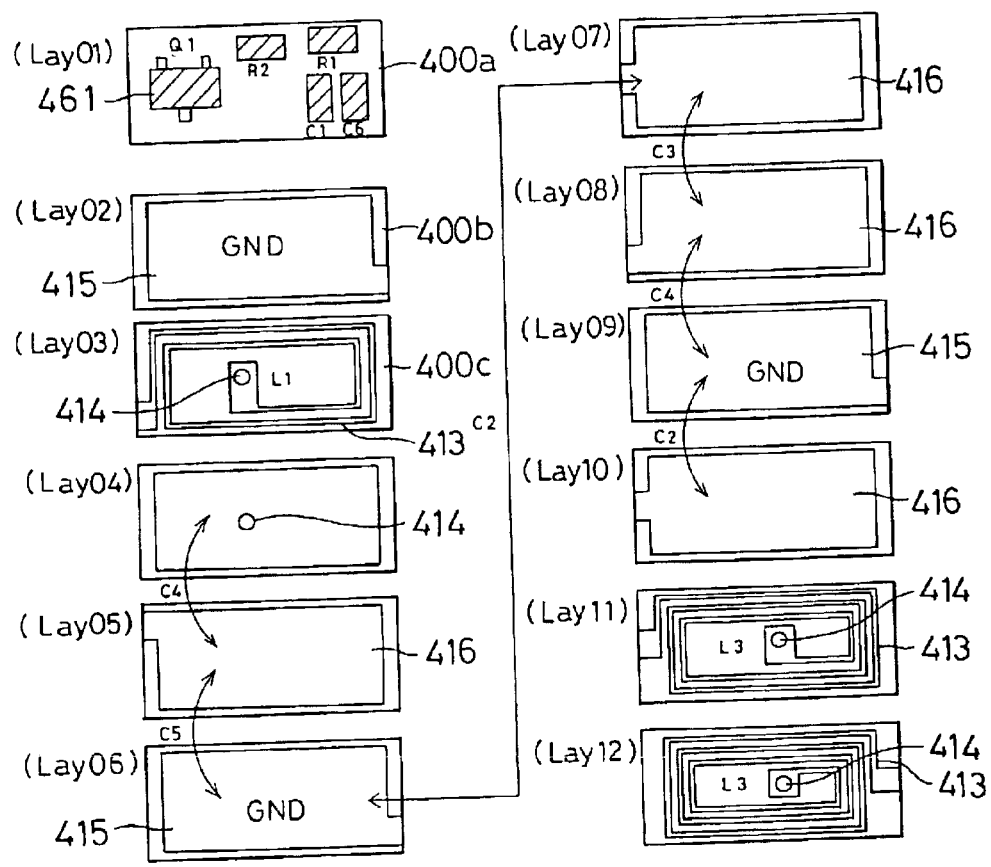
FIG. 40 illustrates a superposed module as one exemplary electronic part of the invention.
Figure 41:
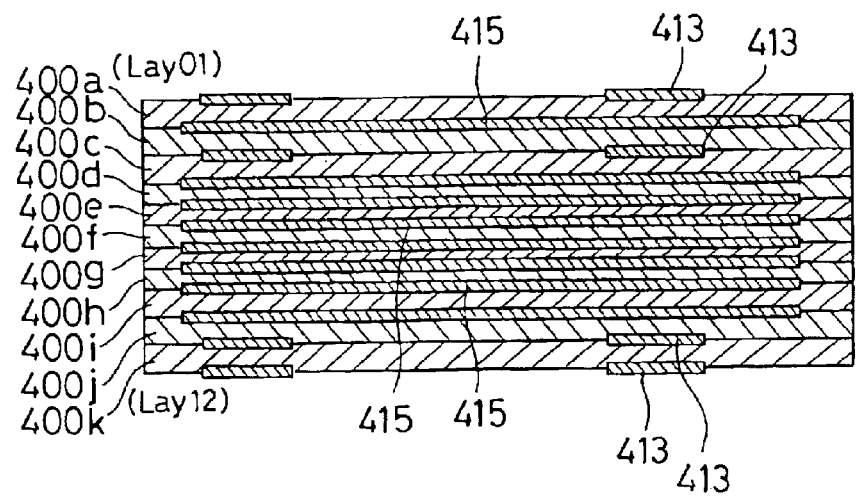
FIG. 41 illustrates a superposed module as another exemplary electronic part of the invention.
Figure 42:
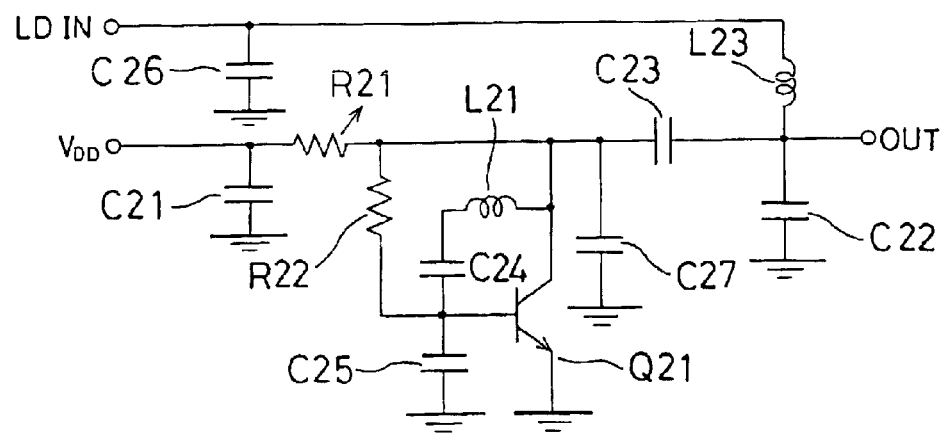
FIG. 42 is an equivalent circuit diagram of the superposed module which is an exemplary electronic part of the invention.

FIGS. 40 to 42 illustrate a superposed module, the module finding use as an optical pickup or the like. FIG. 40 is an exploded plan view of respective constituent layers, FIG. 41 is a cross-sectional view, and FIG. 42 is an equivalent circuit diagram.

In FIGS. 40 to 42, the superposed module includes a stack of constituent layers 400a to 400k, electronic parts 461 formed thereon including capacitors, inductors, semiconductors and registers, and conductor patterns 413, 415 formed above, below and intermediate the constituent layers 400a to 400k. Since the superposed module is constructed to an equivalent circuit as shown in FIG. 42, it further includes inductors L21, L23, capacitors C21 to C27, signal lines, and power supply lines to semiconductor devices. It is advantageous to form the respective constituent layers from materials selected appropriate for their function.

In this example, at least one of the constituent layers 400a to 400k comprises a constituent layer having a thickness of 2 to 40 μm which does not include glass cloth. This constituent layer may further contain a dielectric powder and/or a magnetic powder for the purpose of adjusting the electronic and/or magnetic properties, and optionally, a flame retardant. All constituent layers may not necessarily comprise the same material, and constituent layers comprising different material may be used in combination. Some of the constituent layers may include glass cloth in order to improve the strength of the part.

When the constituent layer including no glass cloth as described above is used for the constituent layers 400d to 400h constructing a capacitor, the thickness of the constituent layer can be drastically reduced and production of a superposed module with reduced size is enabled.

For the constituent layers 400d to 400h constructing capacitors, it is preferred to use constituent layers so as to give a dielectric dissipation factor of 0.0075 to 0.025 and a dielectric constant of 10 to 40 at 1 to 2 gigahertz. For the constituent layers 400a to 400c, and 400j to 400k constructing inductors, it is preferred to use constituent layers having a dielectric dissipation factor of 0.0025 to 0.0075 and a dielectric constant of 2.6 to 5.0 at 1 to 2 gigahertz.

On the surface of constituent layers 400a to 400k, there are provided inner conductors 413, GND conductors 415, and the like. Upper and lower inner conductors are connected by via holes 414. Electronic parts 461 are mounted on the surface, completing a superposed module corresponding to the equivalent circuit of FIG. 42.

This construction enables to provide an appropriate dielectric constant, Q and dielectric dissipation factor for a distinct function, arriving at a high performance, small size, and thin part.

Example 17

Figure 43:
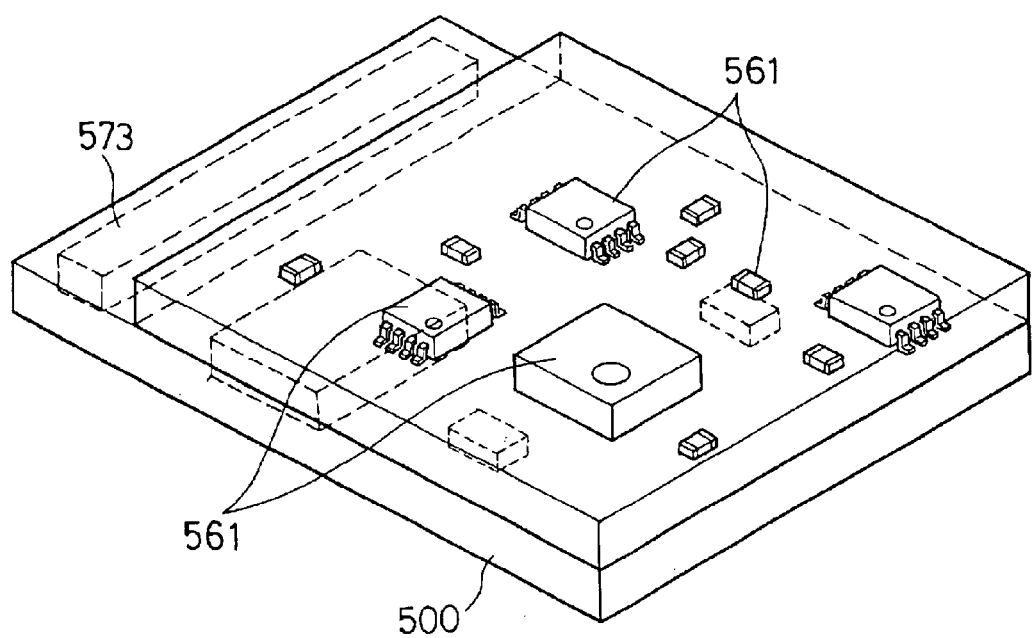
FIG. 43 illustrates an RF module as one exemplary electronic part of the invention.
Figure 44:
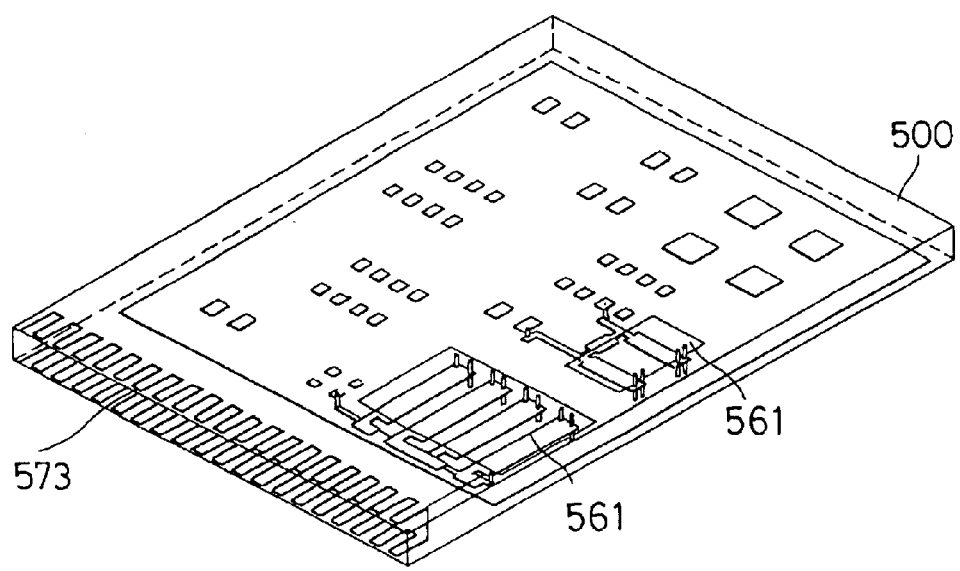
FIG. 44 illustrates an RF module as another exemplary electronic part of the invention.
Figure 45:
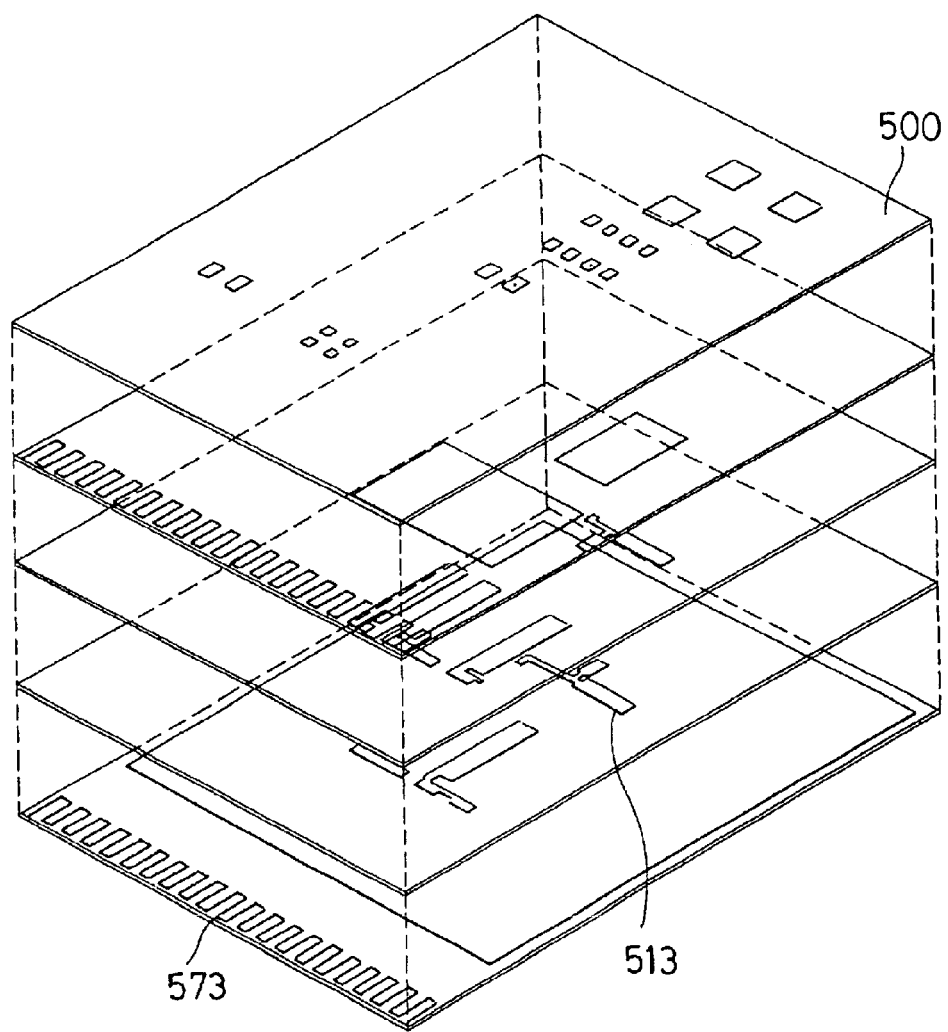
FIG. 45 illustrates an RF module as a further exemplary electronic part of the invention.
Figure 46:
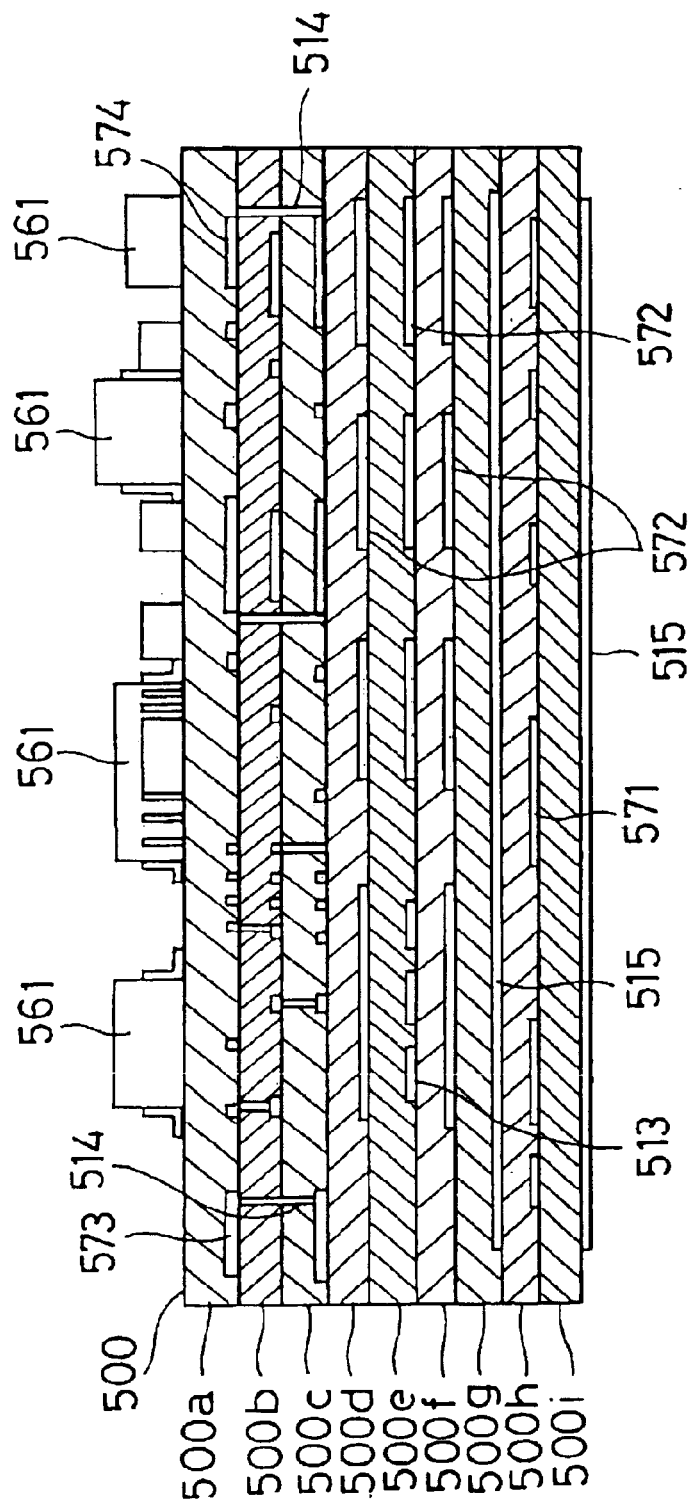
FIG. 46 illustrates an RF module as a still further exemplary electronic part of the invention.

FIGS. 43 to 46 illustrate a RF module. FIG. 43 is a perspective view, FIG. 44 is a perspective view with an outer housing removed, FIG. 45 is an exploded perspective view of respective constituent layers, and FIG. 46 is a cross-sectional view.

In FIGS. 43 to 46, the RF module includes a stack of constituent layers 500a to 500i, electronic parts 561 formed and disposed thereon including capacitors, inductors, semiconductors and registers, conductor patterns 513, 515, 572 formed above, below and intermediate the constituent layers 500a to 500i, and an antenna pattern 573. As mentioned just above, the RF module includes inductors, capacitors, signal lines, and power supply lines to semiconductor devices. It is advantageous to form the respective constituent layers from materials selected appropriate for their function.

In this example, at least one of the constituent layers 500a to 500i comprises a constituent layer having a thickness of 2 to 40 μm which does not include glass cloth. This constituent layer may further contain a dielectric powder and/or a magnetic powder for the purpose of adjusting the electronic and/or magnetic properties, and optionally, a flame retardant. All constituent layers may not necessarily comprise the same material, and constituent layers comprising different material may be used in combination. Some of the constituent layers may include glass cloth in order to improve the strength of the part.

When the constituent layer including no glass cloth as described above is used for the constituent layers 500e to 500f constructing a capacitor, the thickness of the constituent layer can be drastically reduced and production of an RF module with reduced size is enabled.

For the constituent layers 500a to 500d and 500g constructing the antenna, strip lines and wiring in this example, it is preferred to use constituent layers having a dielectric dissipation factor of 0.0025 to 0.0075 and a dielectric constant of 2.6 to 5.0 at 1 to 2 gigahertzs. For the constituent layers 500e to 500f constructing capacitors, it is preferred to use constituent layers so as to give a dielectric dissipation factor of 0.0075 to 0.025 and a dielectric constant of 10 to 40 at 1 to 2 gigahertzs. For the constituent layers 500h to 500i constructing the power supply line, it is preferred to use constitute layers having a magnetic permeability of 3 to 20 at 1 to 2 gigahertzs.

On the surface of constituent layers 500a to 500i, there are provided inner conductors 513, GND conductors 515, antenna conductors 573, and the like. Upper and lower inner conductors are connected by via holes 514. Electronic parts 561 are mounted on the surface, completing a RF module.

This construction enables to provide an appropriate dielectric constant, Q and dielectric dissipation factor for a distinct function, arriving at a high performance, small size, and thin part.

In addition to the above-exemplified electronic parts, the invention is also applicable by a similar procedure to common mode filters, EMC filters, power supply filters, pulse transformers, choke coils, DC-DC converters, delay lines, antenna switch modules, antenna front end modules, isolator/power amplifier modules, PLL modules, front end modules, tuner units, directional couplers, double balanced mixers (DBM), power synthesizers, power distributors, PTC thermistors, etc.

MERITS OF THE INVENTION

As described above, the present invention is capable of providing a multilayer substrate and an electronic part which can be produced into a product thinner than conventional substrates, which exhibits high performance, and which does not suffer from handling problems caused by insufficient strength.

What is claimed is:

1. A method for producing a multi-layer substrate, comprising the steps of: adhering a transfer film comprised of a resin film support layer having an adhesive layer comprised of a base polymer and a foaming agent thereon, the transfer film having an adhesive force ranging from 3.7 to 7.0 N/20 mm to an electrically conductive layer; patterning the conductor layer by etching to form a predetermined pattern; placing the transfer film overlaid with the patterned conductor layer on a prepreg such that the patterned conductor layer is in surface contact with a surface of the prepreg; and then compressing the combined layers and transfer film under a pressure of 4.9 to 39 Mpa while heating at 1300–1700 C; and peeling the transfer film from the conductor layer; thereby leaving the prepreg in contact with the conductor layer.

2. The method for producing a multi-layer substrate according to claim 1, wherein said adhesion by heat and pressure application is conducted under the conditions of a temperature of 140°–160° C. and a processing time of 120 to 180 minutes.

3. The method for producing a multi-layer substrate according to claim 1, further comprising the step of heat treating said transfer film at a temperature of 100°–130° C. for 5 to 20 minutes before placing the transfer film on the prepreg.

4. The method for producing a multi-layer substrate according to claim 1, wherein the prepreg produced comprises a resin, and at least one of a dielectric powder and a magnetic powder dispersed in the resin, and has a thickness of 2 to 40 μm.

5. The method for producing a multi-layer substrate according to claim 1, further comprising the step of placing another prepreg on the patterned surface of said prepreg, and adhering the placed prepreg by applying heat and pressure to produce a multi-layer substrate having an inner conductor pattern.

6. The method for producing a multi-layer substrate according to claim 1, wherein said conductor layer has a surface roughness Rz of 1 to 6 $\mu$m.

7. The method for producing a multi-layer substrate according to claim 1, wherein said conductor layer comprises at least one element selected from Cu, Al, Ag and Au.

8. The method for producing a multi-layer substrate according to claim 1, wherein said conductor layer is formed by electrolysis or rolling.

9. The method for producing a multi-layer substrate according to claim 1, wherein said conductor layer has a thickness of 3 to 32 $\mu$m.

10. The method for producing a multi-layer substrate according to claim 4, wherein said dielectric powder comprises at least one member selected from the group consisting of titanium-barium-neodymium based ceramics, titanium-barium-tin based ceramics, lead-calcium based ceramics, titanium dioxide based ceramics, barium titanate based ceramics, lead titanate based ceramics, strontium titanate based ceramics, calcium titanate based ceramics, bismuth titanate based ceramics, magnesium titanate based ceramics, $CaWO_4$ based ceramics, $Ba(Mg,Nb)O_3$ based ceramics, $Ba(Mg,Ta)O_3$ based ceramics, $Ba(Co,Mg,Nb)O_3$ based ceramics and $Ba(Co,Mg,Ta)O_3$ based ceramics.

11. The method for producing a multi-layer substrate according to claim 4, wherein said dielectric powder comprises at least one member selected from the group consisting of silica, alumina, zirconia, potassium titanate whiskers, calcium titanate whiskers, barium titanate whiskers, zinc oxide whiskers, chopped glass, glass beads, carbon fibers and magnesium oxide.

12. The method for producing a multi-layer substrate according to claim 4, wherein said dielectric powder is present in an amount the range of 10% by volume to less than 65% by volume based on the sum of the resin and the dielectric powder as 100% by volume.

13. The method for producing a multi-layer substrate according to claim 4, wherein said magnetic powder comprises at least one member selected from the group consisting of ferrites of Mn—Mg—Zn, Ni—Zn and Mn—Zn based systems.

14. The method for producing a multi-layer substrate according to claim 4, wherein said magnetic powder comprises at least one member selected from the group consisting of iron carbonyl, iron-silicon based alloys, iron-aluminum-silicon based alloys, iron-nickel based alloys; and amorphous based ferromagnetic metals.

15. The method for producing a multi-layer substrate according to claim 4, wherein said dielectric powder or said magnetic powder has a spherical shape with a projected image of a circle and a sphericity of 0.9 to 1.0, and a mean particle size of 0.1 to 40 $\mu$m.

16. A method for producing an electronic part, comprising the steps of:
forming an electronic device by patterning at least the conductor layer of the multi-layer substrate of claim 4;
forming throughholes which function as terminals for at least one electronic part device; and
cutting the substrate at the positions of said throughholes into each electronic part device to thereby produce the electronic part.

17. The method for producing a multi-layer substrate according to claim 1, wherein the supporting resin film is a member selected from the group consisting of fluororesin films, polyethylene films, polypropylene films, polystyrene films, polyvinyl chloride films, polycarbonate films, polyimide films, polysulfone films, polyether sulfone films, polyamide films, polyamideimide films, polyetherketone films and polyphenylene sulfide films.

18. The method for producing a multi-layer substrate according to claim 1, wherein the supporting resin film has a thickness of about 10 $\mu$m to 200 $\mu$m.

19. The method for producing a multi-layer substrate according to claim 1, wherein the base polymer has a dynamic modulus at room temperature to 150° C., ranging from 500,000 to 10,000,000 $\mu N/cm^2$.

20. The method for producing a multi-layer substrate according to claim 19, wherein the base polymer has a dynamic modulus at room temperature to 150° C. ranging from 500,000 to 8,000,000 $\mu N/cm^2$.

* * * * *

UNITED STATES PATENT AND TRADEMARK OFFICE
CERTIFICATE OF CORRECTION

PATENT NO.    : 6,808,642 B2
DATED         : October 26, 2004
INVENTOR(S)   : Minoru Takaya et al.

It is certified that error appears in the above-identified patent and that said Letters Patent is hereby corrected as shown below:

Column 11,
Line 7, "[68 = 37, Q=5000]", should read -- [$\epsilon$ = 37, Q=5000] --;
Lines 36 and 43, "(BaPb)Nd$_2$Ti5O$_{14}$" should read -- (BaPb)Nd$_2$Ti$_5$O$_{14}$ --;

Column 28,
Line 50, "1300-1700 C" should read -- 130º-170º C --.

Signed and Sealed this

Twenty-sixth Day of April, 2005

JON W. DUDAS
*Director of the United States Patent and Trademark Office*